United States Patent
Shibuya

(10) Patent No.: US 6,584,603 B1
(45) Date of Patent: Jun. 24, 2003

(54) APPARATUS AND METHOD FOR DETERMINING A CIRCUIT FLOOR PLAN

(75) Inventor: Toshiyuki Shibuya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 151 days.

(21) Appl. No.: 09/667,218

(22) Filed: Sep. 21, 2000

(30) Foreign Application Priority Data

Nov. 1, 1999 (JP) .......................................... 11-310724

(51) Int. Cl.[7] .............................. G06F 9/45; G06F 17/50
(52) U.S. Cl. ...................... 716/8; 716/8; 716/9; 716/10
(58) Field of Search .......................... 716/1, 4, 2, 8–11; 700/110

(56) References Cited

U.S. PATENT DOCUMENTS

| | | | | |
|---|---|---|---|---|
| 5,309,371 A | * | 5/1994 | Shikata et al. | 716/10 |
| 5,416,720 A | * | 5/1995 | Fukui | 716/9 |
| 5,493,510 A | * | 2/1996 | Shikata | 716/9 |
| 6,173,433 B1 | * | 1/2001 | Katoh et al. | 716/1 |
| 6,317,859 B1 | * | 11/2001 | Papadopoulou | 700/110 |

* cited by examiner

Primary Examiner—Matthew Smith
Assistant Examiner—Binh Tat
(74) Attorney, Agent, or Firm—Staas & Halsey LLP

(57) ABSTRACT

When a location descriptive sentence is operated, a floor plan is generated is such a way that a circuit block of fixed shape can be laid out by assigning a rotation code to the circuit block of fixed shape or merging the circuit block of fixed shape with another circuit block.

11 Claims, 22 Drawing Sheets

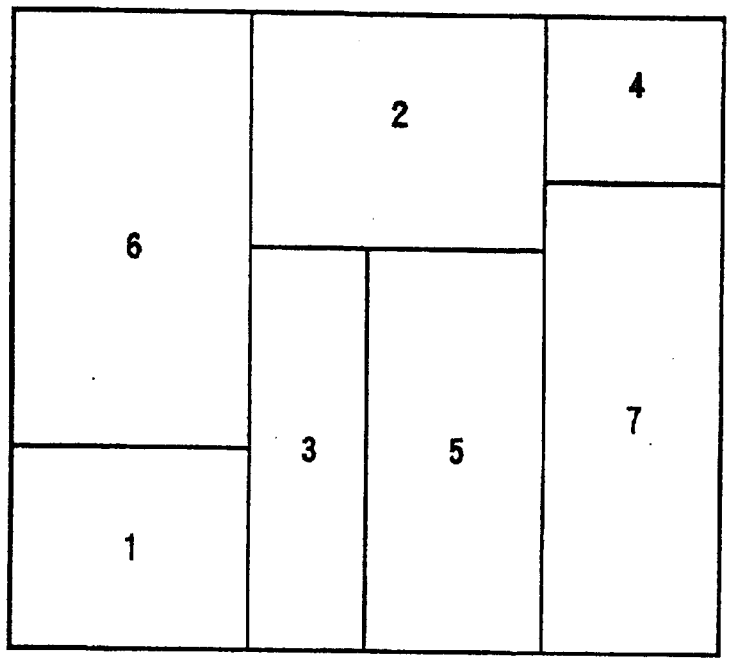
F I G. 1A
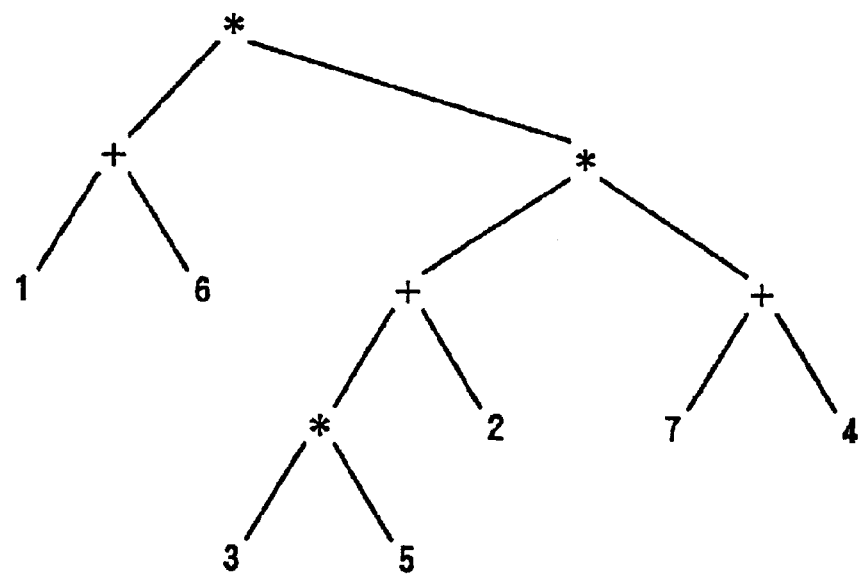
1 6 + 3 5 * 2 + 7 4 + * *
F I G. 1B

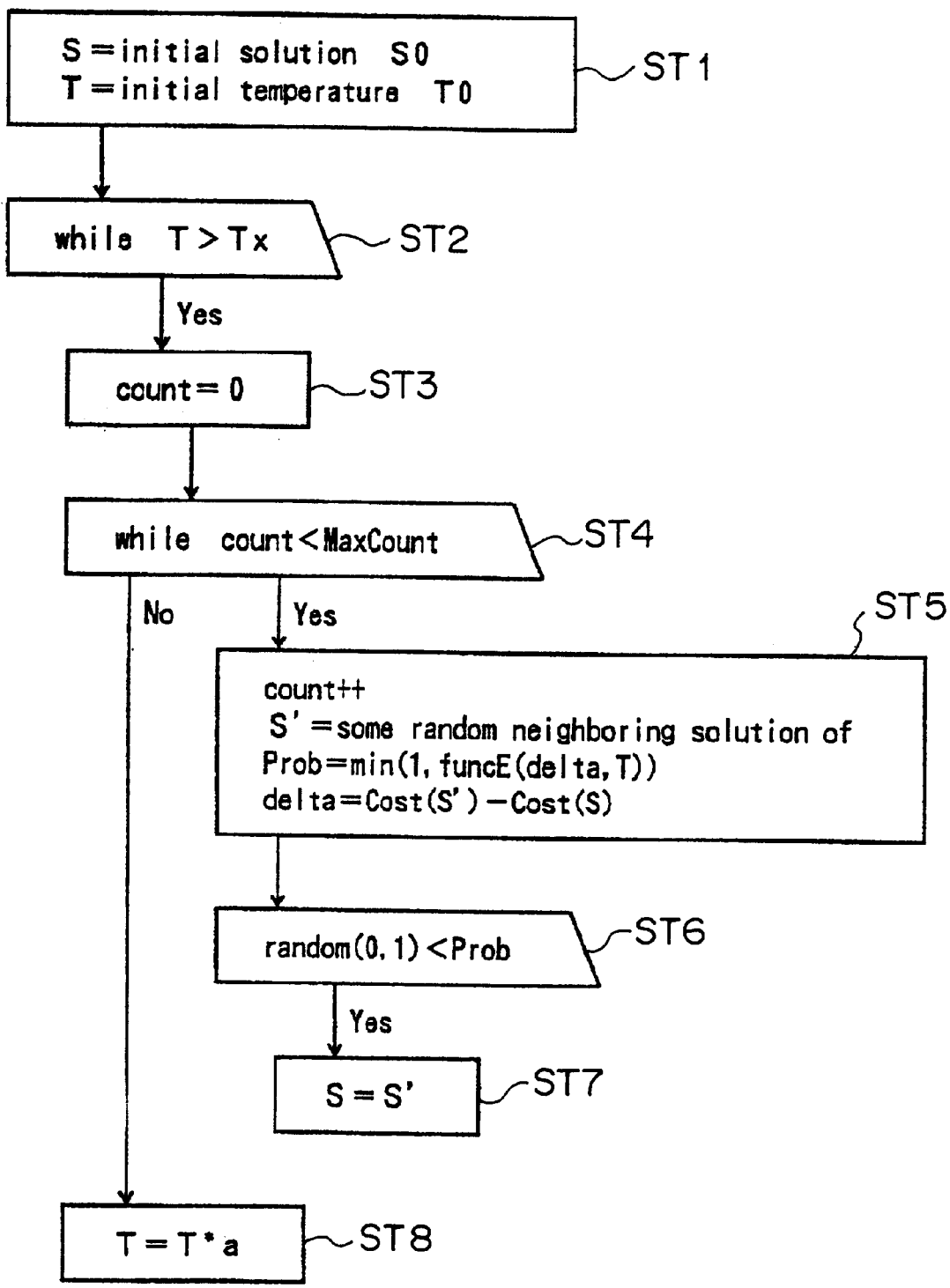
F I G. 1C

| BLOCK ID | AREA | FIXED SHAPE FLAG | BLOCK SHAPE | | ROTATION CODE | NUMBER OF NETS IN A BLOCK |
|---|---|---|---|---|---|---|
| | | | x | y | | |
| 1 | 10 | T | 2 | 5 | 1 | 0 |
| 2 | 20 | F | | | | 300 |
| 3 | 10 | F | | | | 200 |
| 4 | 10 | F | | | | 100 |
| 5 | 10 | T | 3.2 | 3.2 | 3 | 0 |
| 6 | 30 | F | | | | 400 |
| 7 | 20 | F | | | | 150 |
| ... | ... | ... | ... | ... | ... | ... |

FIG. 3

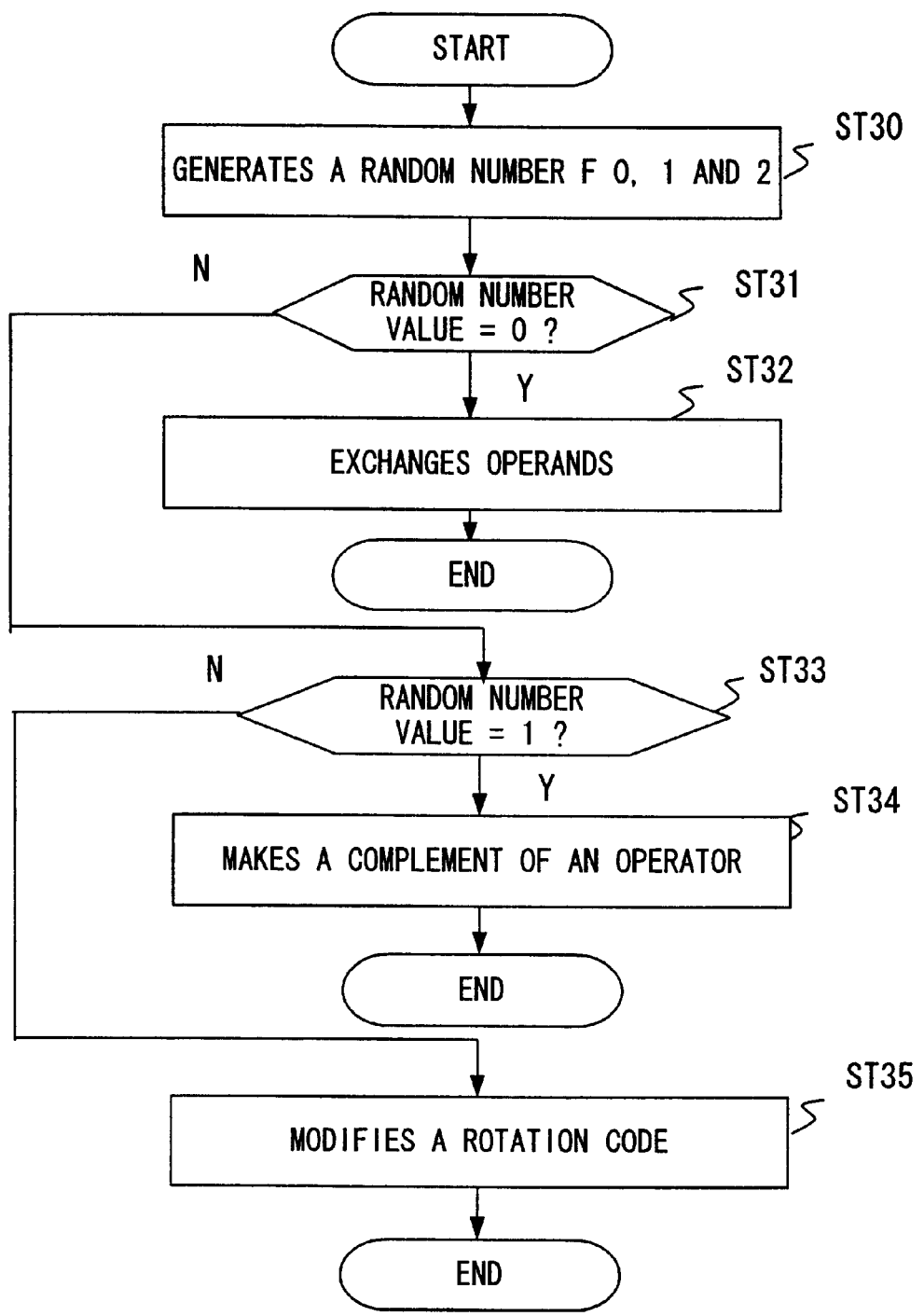
F I G. 7 half-perimeter-intra-block(i) = $\alpha + \beta$ half-perimeter-inter-block(j) = $\gamma + \delta$

| NET ID | UPPER LIMIT VALUE OF WIRE LENGTH |
|--------|----------------------------------|
| 1 | 50 μm |
| 2 | 20 μm |
| 3 | 70 μm |
| 4 | 150 μm |
| 5 | 250 μm |
| 6 | 500 μm |
| 7 | 10 μm |
| 8 | 40 μm |

| BLOCK ID | AREA | FIXED SHAPE FLAG | PARENT BLOCK ID | NUMBER OF NETS IN A BLOCK |
|---|---|---|---|---|
| 1 | 10 | T | 6 | 0 |
| 2 | 20 | F |  | 300 |
| 3 | 10 | F |  | 200 |
| 4 | 10 | F |  | 100 |
| 5 | 10 | T | 3 | 0 |
| 6 | 30 | F |  | 400 |
| 7 | 20 | F |  | 150 |
| ⋮ | ⋮ | ⋮ | ⋮ | ⋮ |

FIG. 11

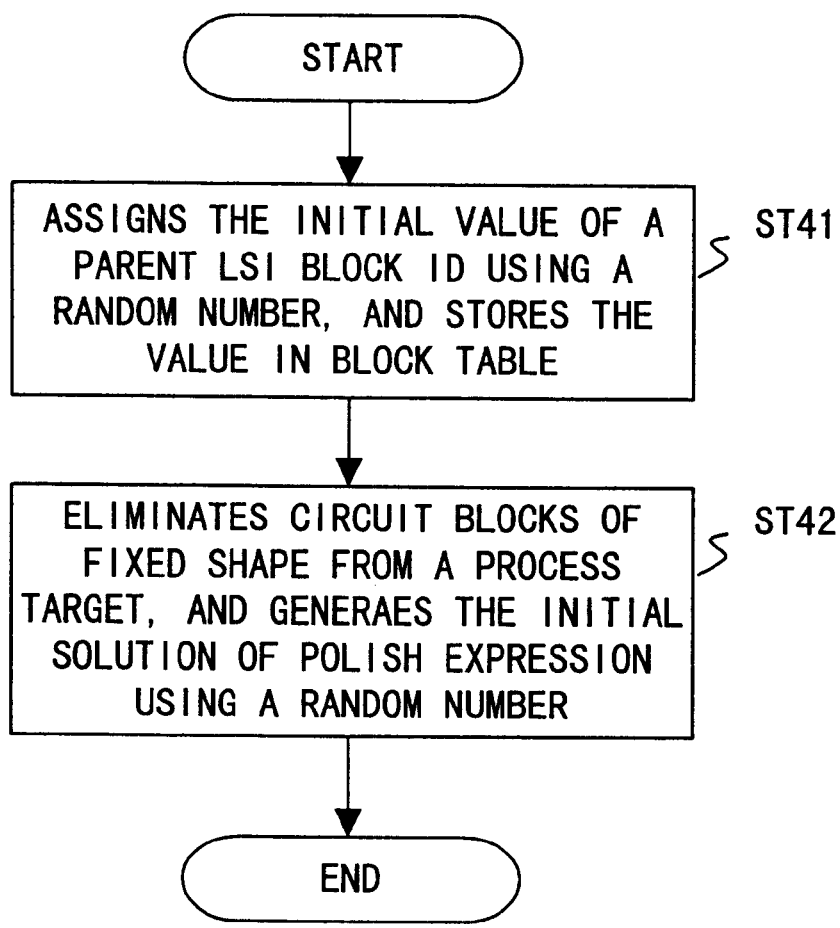
F I G. 1 2

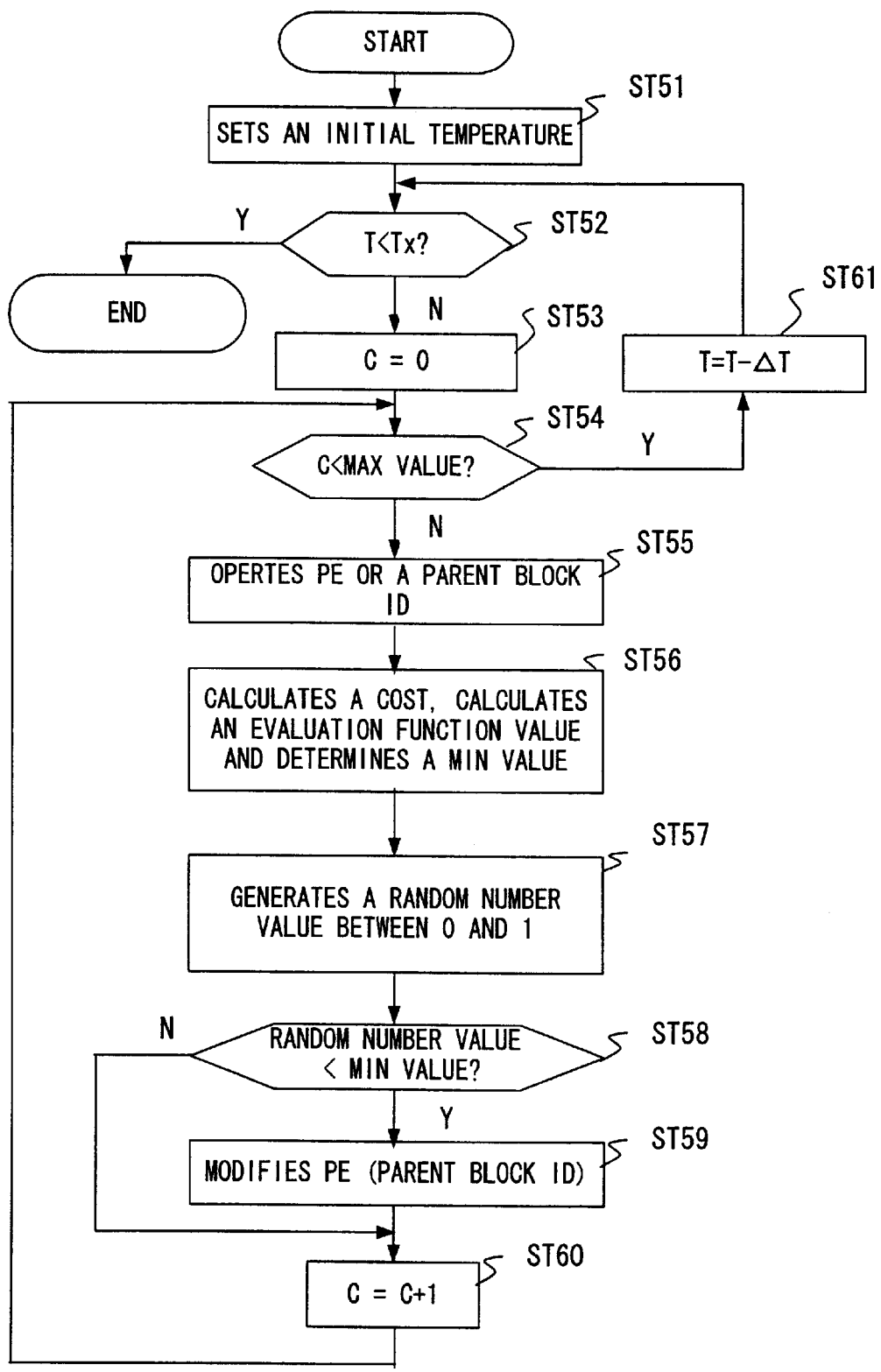
F I G. 1 3

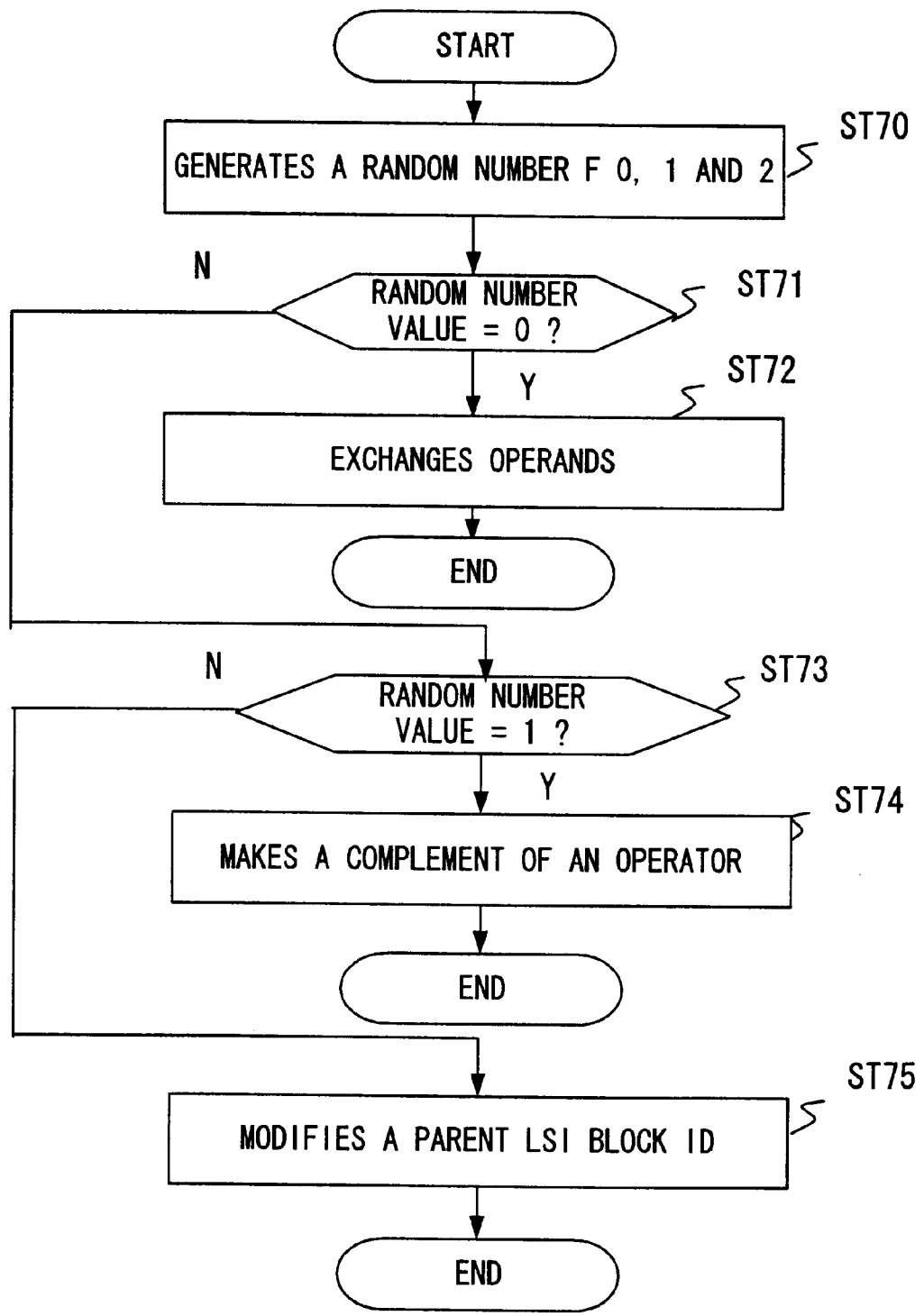
F I G. 1 4

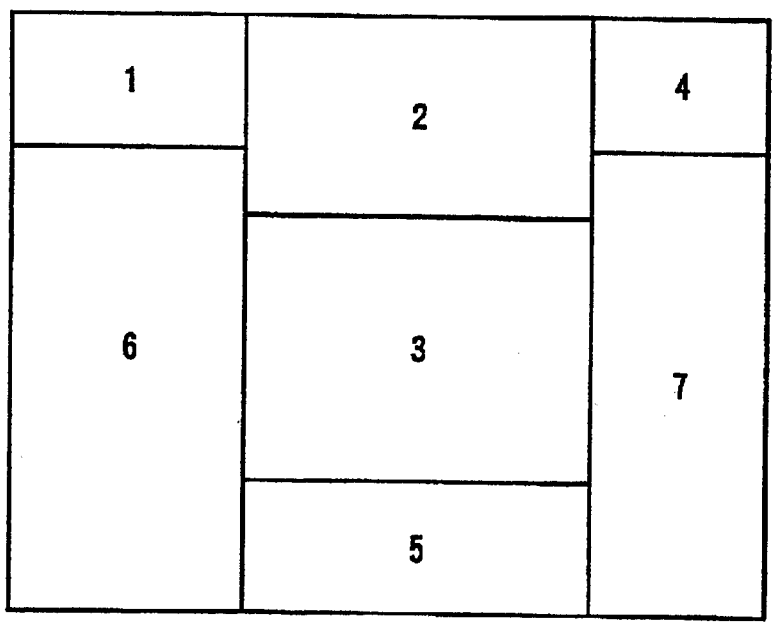
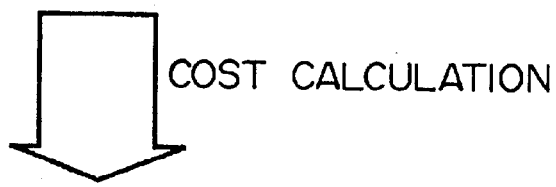
COST CALCULATION
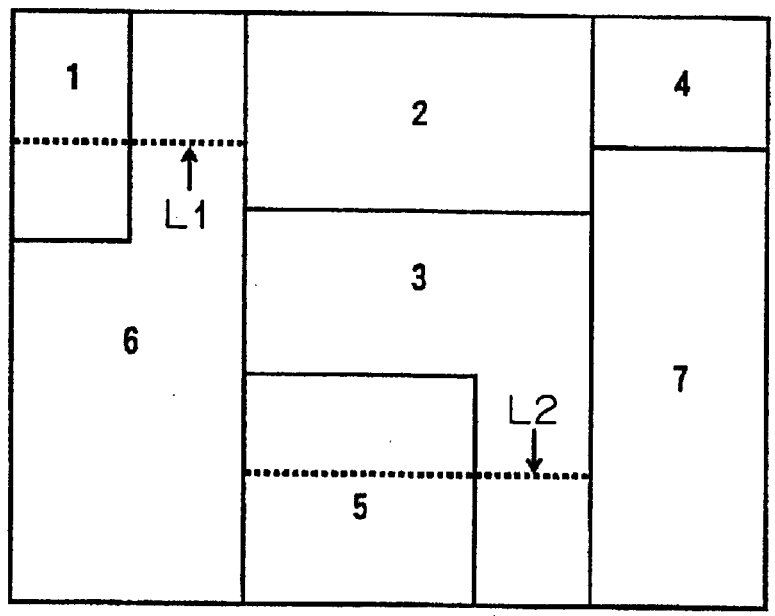
FIG. 15

| BLOCK ID | AREA | FIXED SHAPE FLAG | BLOCK SHAPE | | ROTATION CODE | PACKING PRIORITY | PACKING PRIORITY DIRECTION | NUMBER OF NETS IN A BLOCK |
|---|---|---|---|---|---|---|---|---|
| | | | x | y | | | | |
| 1 | 10 | T | 2 | 5 | 1 | 1 | ULRD | 0 |
| 2 | 20 | F | | | | | | 300 |
| 3 | 10 | F | | | | | | 200 |
| 4 | 10 | F | | | | | | 100 |
| 5 | 10 | T | 32 | 32 | 3 | 2 | DLRU | 0 |
| 6 | 30 | F | | | | | | 400 |
| 7 | 20 | F | | | | | | 150 |
| . . . . . . | . . . . . . | . . . . . . | . . . . . . | . . . . . . | . . . . . . | . . . . . . | . . . . . . | . . . . . . . |

FIG. 16

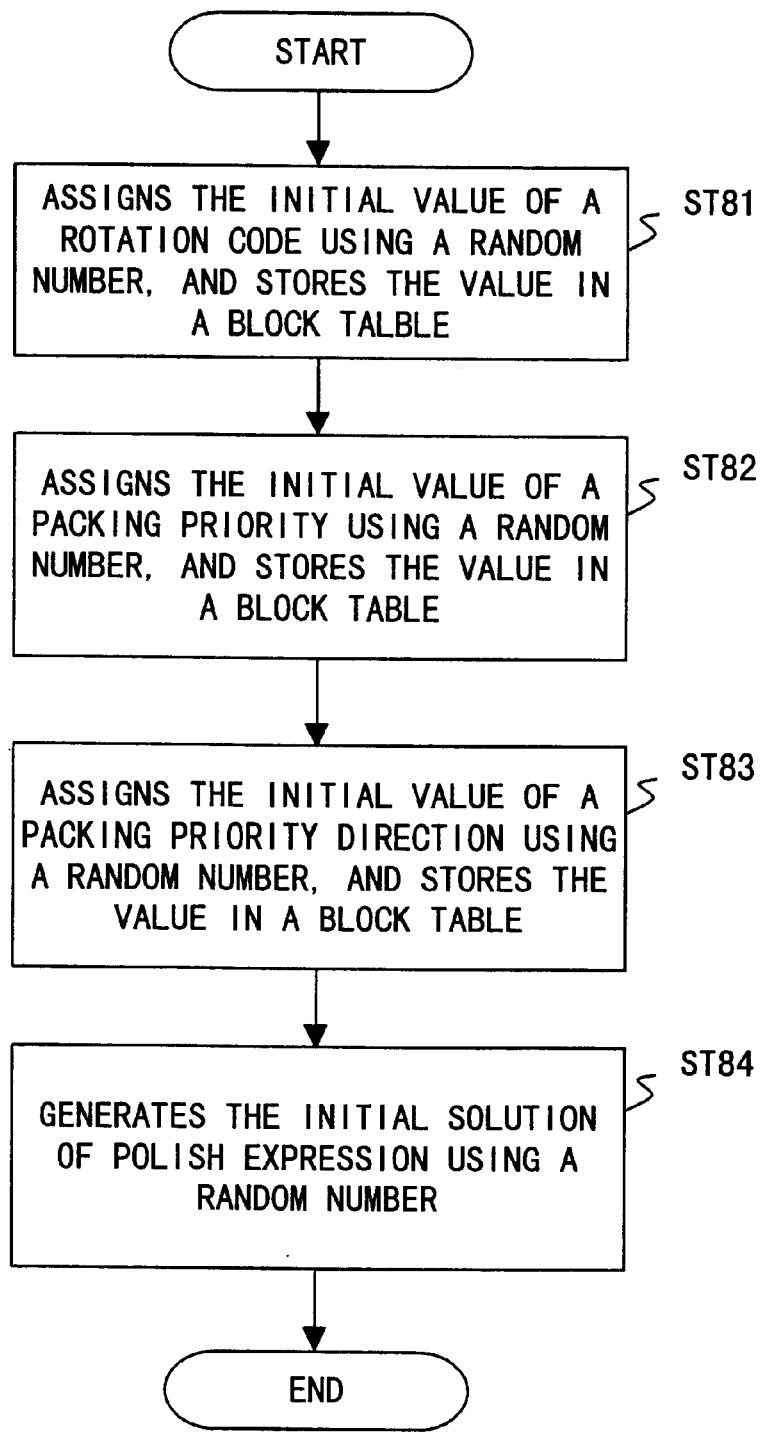
F I G. 17

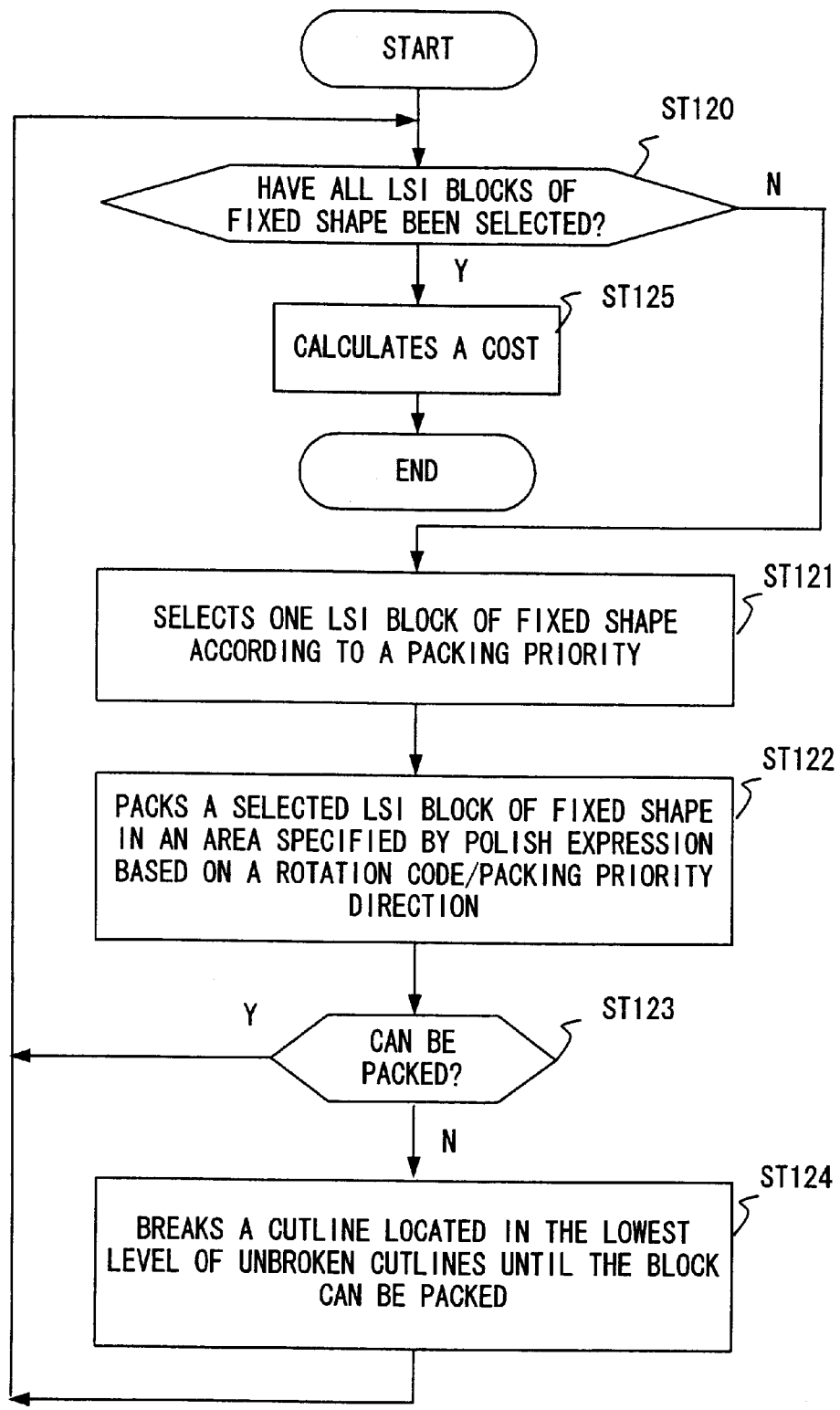
F I G. 2 0

APPARATUS AND METHOD FOR DETERMINING A CIRCUIT FLOOR PLAN

BACKGROUND OF THE INVENTION

1. Field of the Invention

The present invention relates to a floor plan determination apparatus/method for the circuit, such as an LSI (Large Scale Integration) circuit, etc., and a program storage medium used to implement the apparatus, and in particular it relates to the apparatus/method for an LSI block of fixed shape and the medium used to implement such an apparatus.

Along with the recent advancement of circuit technologies, the degree of integration of an LSI (in particular a VLSI) has remarkably improved and the circuit size has also remarkably increased. Along with both the improvement in the degree of integration and the increase of the circuit size, the number of blocks and RAMs (RandomAccessMemory) included in one LSI has also increased. Therefore, if a layout of a floor plan is manually generated, an optimal layout cannot be always obtained and it also takes time. In this way, the development of a technology to enable the acquisition of an optimal floor plan in a small CPU time and to improve the turn around time is demanded.

2. Description of the Related Art

When the layout of an LSI is automatically generated, first, functions of the LSI are divided. Then, a chip area required to implement the respective functions is calculated. Finally, the LSI floor plan is determined by dividing the LSI chip area into a plurality of rectangular areas.

A floor plan optimization method by a slicing tree used in this method is widely known.

In the floor plan by a slicing tree, hierarchical partitioning is repeated and the rectangular shape and location of each LDS block are calculated. This hierarchical structure is expressed by a character string of Polish expression.

For example, if a vertical cutline and a horizontal cutline are expressed as "*" and "+", respectively, the floor plan shown in FIG. 1A can be expressed by the following Polish expression, as shown in FIG. 1B.

$$16+35*2+74+**$$

The "*" and "+" are called operators, and figures are called operands.

In the floor plan by a slicing tree, a floor plan is optimized by transforming this Polish expression, which means transforming the tree structure of a slicing tree.

As an optimization algorithm, for example, Simulated Annealing (hereinafter called "SA") is used.

As shown in FIG. 1C, in this SA, the initial solution S0 and initial temperature T0 of Polish expression are set (step ST1), and Polish expression is operated at each set temperature T (step ST8) until the temperature reaches a stipulated termination temperature Tx (steps ST2, ST3 and ST4). In this way, it is assumed that Polish expression is transformed from S to S' and the cost of S Cost(S) and cost of S' Cost(S') at that time are calculated. Then, the following value is calculated (step ST5).

$$\min(1, e^{-[Cost(S')-Cost(S)]/T})$$

If the value is larger than a random real value which is generated between 0 and 1, S is transformed to S', and if the value is smaller than the value, S is not transformed (steps ST6 and ST7). This operation is repeated and if the number of repetitions reaches a stipulated number MaxCount, temperature T is reduced toward Tx. In this way, the optimal solution of Polish expression is calculated.

As the transformation operation of Polish expression, exchanging two adjacent operands of Polish expression, or extracting a specific part of Polish expression and making a complement (transforming "*" to "+" or "+" to "*") of an operator included in the art are prepared.

In SA, if Cost(S')<Cost(S), the following inequality holds true.

$$e^{-[Cost(S')-Cost(S)]/T} > 1$$

Therefore, the following equation holds true.

$$\min(1, e^{-[Cost(S')-Cost(S)]/T}) = 1$$

In this way, if the value becomes larger than a random value which is generated between 0 and 1, S is always transformed to S'. Specifically, if the cost decreases (a high evaluation value is obtained), S is always transformed to S'.

However, if Cost(S')>Cost(S), the following expression holds true.

$$e^{-[Cost(S')-Cost(S)]/T} = m < 1$$

In the above expression, the higher temperature T is, the closer to 1 m is. Therefore, the following inequality holds true.

$$\min(1, e^{-[Cost(S')-Cost(S)]/T}) < 1$$

In this way, some time S is transformed to S' and other times S is not transformed to S' depending on a random value which is generated between 0 and 1. In this case, the higher the temperature, the higher a possibility that S may be transformed to S'.

Specifically, in SA, when the value is in the initial state of high temperature, S is sometimes transformed to S' even if the cost increases. Therefore, there is a possibility of obtaining a better solution compared with another optimization algorithm, regardless of the initial solution.

In the conventional LSI floor plan by a slicing tree, division is made taking into consideration only the area of each LSI block and the shape. For example, a final cutline is drawn according to the division form specified by Polish expression and depending on the area of each LSI block. Therefore, if an LSI block the shape of which is specified must be laid out, a floor plan in which such an LSI block can be laid out cannot be prepared, which is a problem.

Specifically, a RAM of fixed shape, etc., is sometimes mounted on an LSI chip. In this case, in the conventional LSI floor plan by a slicing tree, if an LSI block of fixed shape, such as a RAM, etc., must be laid out, a floor plan cannot be prepared in such a way that an LSI block can be laid out since the shape of the LSI block is not taken into consideration, which is a problem.

SUMMARY OF THE INVENTION

It is an object of the present invention to provide an LSI floor plan determination apparatus for determining an LSI floor plan in such a way that the layout of an LSI block of fixed shape can also designated, a method there of and a program storage medium on which is recorded a program used to implement such an apparatus.

In the first aspect of the present information, the floor plan determination apparatus comprises an execution device, an assignment device and a determination device.

The execution device either inputs or generates the initial solution of layout descriptive information that describes the layout of circuit blocks, which is a circuit floor plan. The assignment device assigns the initial value of a rotation code indicating the orientation of a circuit block to a circuit block of fixed shape described in the layout descriptive information. The determination device determining a circuit floor plan by repeating a process of operating either the layout descriptive information or rotation code on a condition that a circuit block of fixed shape can be laid out, calculating the evaluation value of a floor plan obtained after the operation and judging whether either the layout descriptive information or rotation code should be modified, based on the evaluation value.

In the second aspect of the present invention, the floor plan determination apparatus comprises an execution device, an assignment device and a determination device.

The execution device executes either inputs or generates the initial solution of layout descriptive information that describes the layout of circuit blocks, which is a circuit floor plan omitting circuit blocks of fixed shape. The assignment device assigns the initial value of a circuit block of non-fixed shape, which is a parent block, including the circuit block of fixed shape, to the circuit block of fixed shape. The determination device determines a circuit floor plan by repeating a process of operating either the layout descriptive information or parent block, calculating the evaluation value of a floor plan obtained after the operation and judging whether either the layout descriptive information or rotation code should be modified, based on the evaluation value.

In the third aspect of the present invention, the floor plan determination apparatus comprises an execution device and a determination device.

The execution device either inputs or generates the initial solution of layout descriptive information that describes the layout of circuit blocks, which is a circuit floor plan. The determination device reaches a determination by repeating a process of operating layout descriptive information, merging a circuit block of fixed shape with one or more other circuit blocks if a circuit block of fixed shape cannot be laid out in a floor plan specified by layout descriptive information after the operation, packing the circuit block of fixed shape in an area obtained by the merger, calculating the evaluation value of the floor plan obtained after the packing and judging whether the layout descriptive information should be modified, based on the evaluation value.

BRIEF DESCRIPTIONS OF THE DRAWINGS

FIG. 1A shows an LSI floor plan.

FIG. 1B shows Polish expression.

FIG. 1C shows Simulated Annealing.

FIG. 3 shows an example of a block table.

FIG. 7 is another flowchart showing the process of an LSI floor plan determination program.

FIG. 11 shows another block table.

FIG. 12 is another flowchart showing the process of an initialization process execution program.

FIG. 13 is another flowchart showing the process of an LSI floor plan determination program.

FIG. 14 is another flowchart showing the process of an LSI floor plan determination program.

FIG. 15 shows another preferred embodiment of the present invention.

FIG. 16 is another block table.

FIG. 17 is another flowchart showing the process of an initialization process execution program.

FIG. 20 is another flowchart showing the process of an LSI floor plan determination program.

DESCRIPTION OF THE PREFERRED EMBODIMENTS

The preferred embodiments of the present invention are described below with reference to the drawings.

Figure 2A:
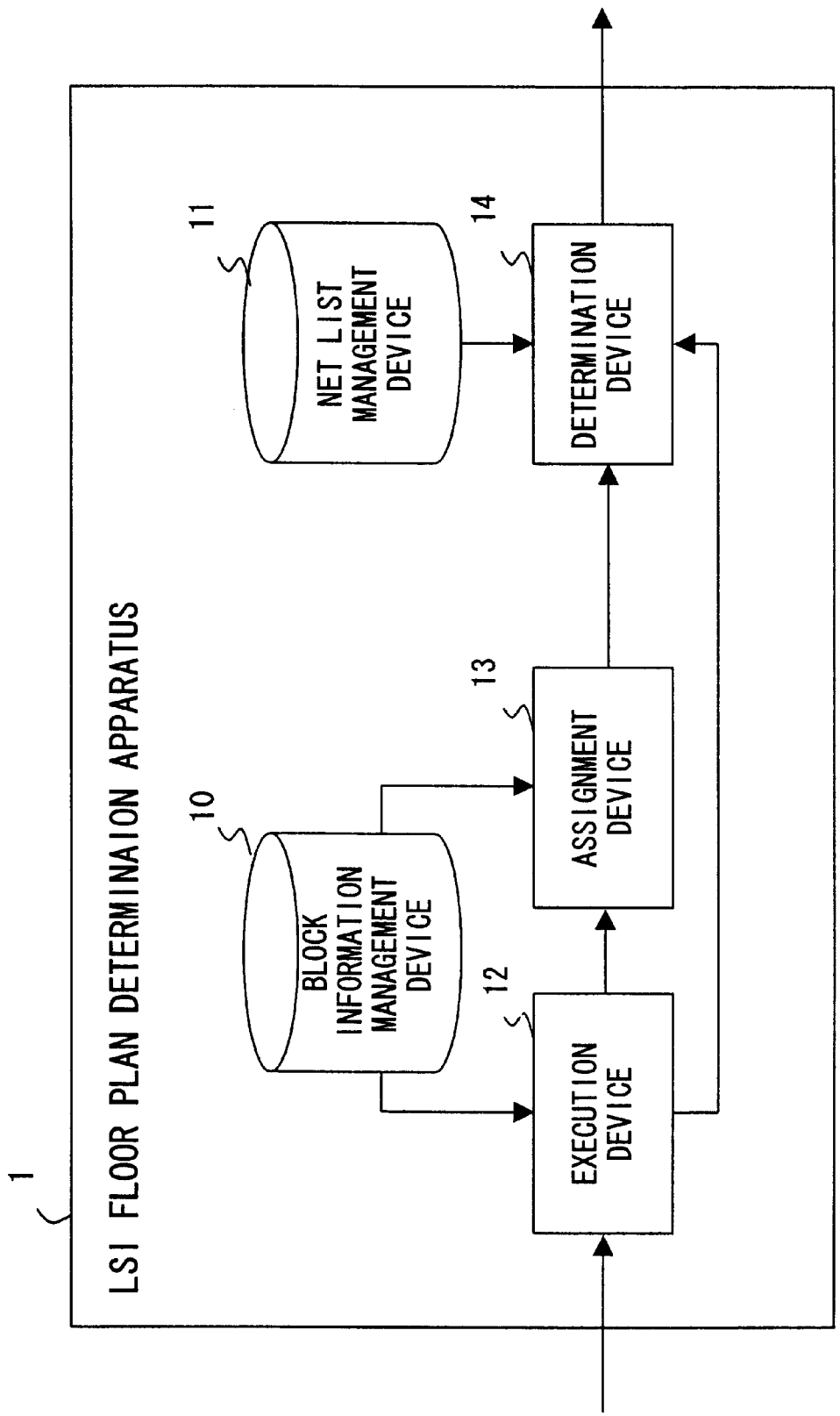
FIG. 2A shows the basic configuration of the present invention.

FIG. 2A shows the basic configuration of the present invention.

In FIG. 2A, the LSI floor plan determination apparatus of the present invention is represented by 1, and it determines an LSI floor plan in such a way that an LSI block of fixed shape can also be laid out.

The LSI floor plan determination apparatus 1 of the present invention comprises a block information management device 10, a net list management device 11, an execution device 12, an assignment device 13 and a determination device 14.

This block information management device 10 manages the area of an LSI block, information about whether the LSI block has a fixed shape and information about the number of nets wired in the LSI block, etc., in relation to the ID of an LSI block to be laid out in a floor plan. The net list management device 11 manages the ID of an LSI block connected to the net in relation to the ID of a net connected to a plurality of LSI blocks.

The execution device 12 inputs or generates the initial solution of a layout descriptive sentence (for example, Polish expression) that describes the layout of LSI blocks, which is a circuit floor plan in a tree structure, or inputs or generates the initial solution of the layout descriptive sentence that describes the layout of LSI blocks, which is a circuit floor plan in a tree structure omitting LSI blocks of fixed shape.

The assignment device 13 assigns the initial value of a rotation code, which indicates the orientation of an LSI block, to an LSI block of fixed shape, assigns the initial value of an LSI block of non-fixed shape (of variable shape), which is a parent, including the LSI block of fixed shape to the LSI block of fixed shape, assigns the initial value of a packing priority, which is the execution order of the packing among LSI blocks, to the circuit block of fixed shape or assigns the initial value of a packing priority direction, which is the execution order of the packing direction of an LSI block to an LSI block of fixed shape.

The determination device 14 determines an LSI floor plan by repeating a process of operating a layout descriptive sentence, etc., calculating the evaluation value and judging whether the layout descriptive sentence, etc., should be modified, based on the evaluation value.

The functions of the LSI floor plan determination apparatus 1 of the present invention are specifically implemented by a program. This program is stored in a floppy disk, etc., or a disk of a server, etc., and the present invention can be implemented by installing the program in the LSI floor plan determination apparatus 1 of the present invention and storing the program in a memory.

In the LSI floor plan determination apparatus of the present invention configured in such a way, the execution device 12 inputs or generates the initial solution of a layout descriptive sentence that describes the layout of LSI blocks, which is a circuit floor plan in a tree structure. Then, the assignment device 13 assigns the initial value of a rotation code, which indicates the orientation of an LSI block to an LSI block of fixed shape described in the layout descriptive sentence.

Then, the determination device 14 determines an LSI floor plan by repeating a process of operating both the rotation code and layout descriptive sentence, calculating the evaluation value on condition that an LSI block of fixed shape can be laid out and judging whether the layout descriptive sentence and/or rotation code should be modified, based on the evaluation value.

In this way, the LSI floor plan determination apparatus 1 of the present invention can determine an LSI floor plan in such a way that the fixed shape of an LSI block can be prevented from being deformed.

Accordingly, an LSI floor plan can be determined in such a way that an LSI block of fixed shape can also be laid out.

In the LSI floor plan determination apparatus 1 of the present invention configured in such a way, the execution device 12 inputs or generates the initial solution of the layout descriptive sentence that describes the layout of LSI blocks, which is an LSI floor plan in a tree structure. Then, the assignment device 13 assigns the initial value of an LSI block of non-fixed shape, which is a parent, including an LSI block of fixed shape, to the LSI block of fixed shape.

Then, the determination device 14 determines an LSI floor plan by repeating a process of operating the layout descriptive sentence, including the parent LSI block, calculating the evaluation value and judging whether the layout description sentence and/or parent LSI block should be modified, based on the evaluation value.

In this way, according to the LSI floor plan determination apparatus 1 of the present invention, an LSI floor plan can be determined in such a way that an LSI block of fixed shape is merged with an LSI block of non-fixed shape.

In this way, an LSI block of fixed shape imerged with an LSI block of non-fixed shape. Therefore, there is a high possibility of maintaining the fixed shape, and an LSI floor plan can be determined in such a way that an LSI block of fixed shape can be laid out.

In the LSI floor plan determination apparatus of the present invention configured in such a way, the execution device 12 inputs or generates a layout descriptive sentence that describes the layout of LSI blocks, which is an LSI floor plan in a tree structure. Then, the determination device 14 determines an LSI floor plan by repeating a process of operating the layout descriptive sentence. If an LSI block of fixed shape cannot be laid out in an LSI floor plan specified by the layout descriptive sentence obtained by the operation, the determination device 14 determines an LSI floor plan by merging the LSI block of fixed shape with one or more other LSI blocks, packing the LSI block there, calculating the evaluation value and judging whether the layout descriptive sentence should be modified, based on the value in order to enable the layout of the LSI block of fixed shape.

In this case, the determination device 14 sometimes sequentially selects LSI blocks to be merged in an ascending order of a tree level designated by the LSI block of fixed shape that cannot be laid out in order to enable the layout of the LSI block of fixed shape.

The determination device 14 also sometimes selects a layout descriptive sentence part that is located lower in a tree level designated by the merged LSI block rather than a layout descriptive sentence part, with a higher probability since the determination device positively searches for a location where an LSI block of fixed shape that could not be laid out can be determined.

Furthermore, in this case, sometimes the assignment device functions, assigns the initial value of a rotation code, which indicates the orientation of an LSI block, to an LSI block of fixed shape, assigns the initial value of a packing priority, which is the execution order of the packing among LSI blocks, to the LSI block of fixed shape or assigns the initial value of a packing priority direction, which is the execution order of the packing direction of an LSI block, to the LSI block of fixed shape. Then, the determination device 14 sometimes determines an LSI floor plan by operating the rotation code, layout descriptive sentence, packing priority and packing priority direction.

In this way, according to the LSI floor plan determination apparatus 1 of the present invention, an LSI floor plan can be determined in such a way that it costs much if an LSI block of fixed shape is laid out with the fixed shape maintained.

In this way, an LSI floor plan can be determined in such a way that an LSI block of fixed shape can be laid out.

Figure 2B:
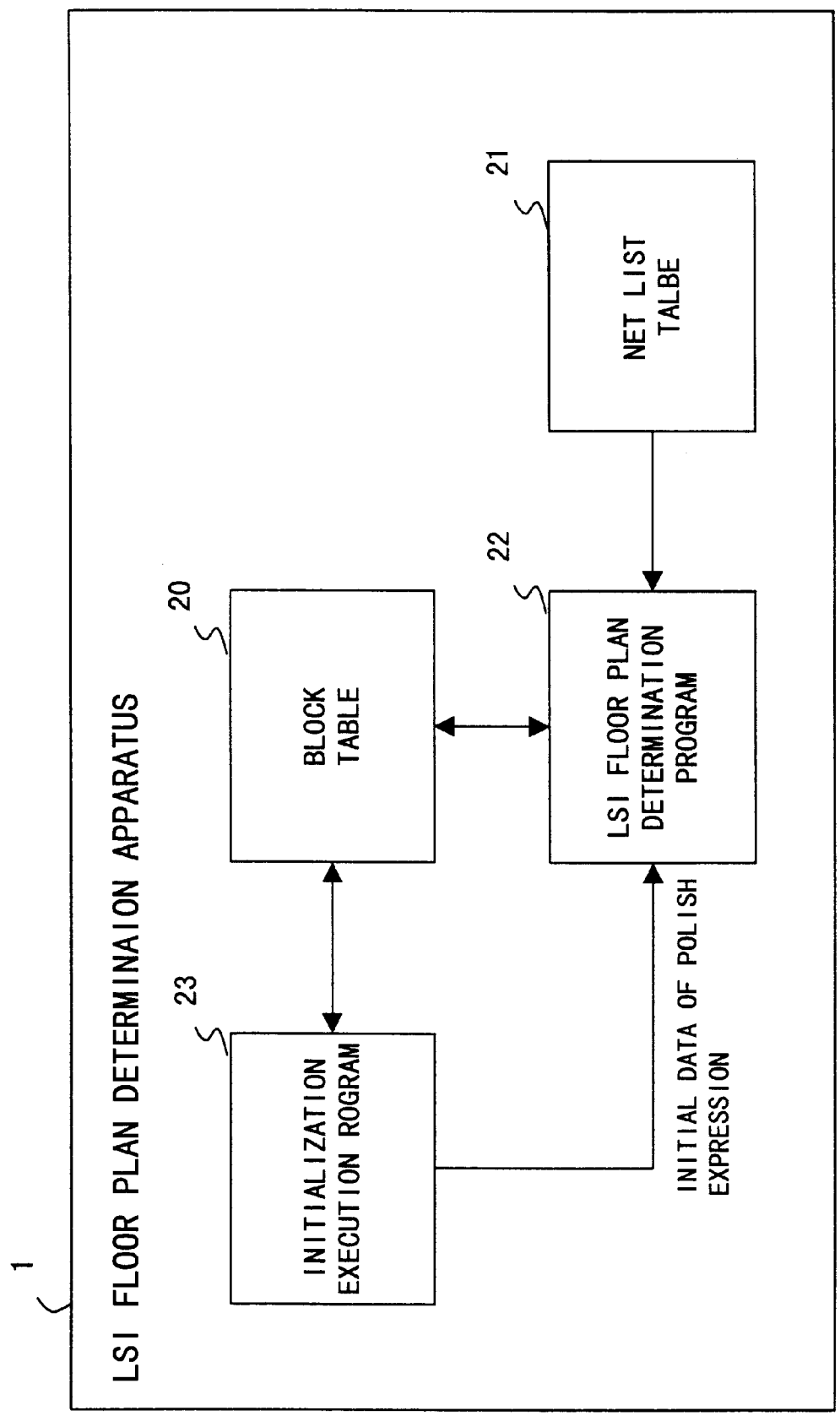
FIG. 2B shows one preferred embodiment of the present invention.

FIG. 2B shows one preferred embodiment of the LSI floor plan determination apparatus 1 of the present invention.

The LSI floor plan determination apparatus 1 of this preferred embodiment of the present invention is comprised a block table 20, a net list table 21, an LSI floor plan determination program 22 for determining an LSI floor plan according to an SA optimization algorithm and an initialization process execution program 23 for executing an initialization process required to run the LSI floor plan determination program 22.

In this case, the LSI floor plan determination program 22 and initialization process execution program 23 can be stored in an appropriate storage medium, such as a computer-readable semi-conductor memory, etc.

If these programs are stored in a server in a network, the server generates propagating signals for transmitting the programs and transmits the signals to the LSI floor plan determination apparatus 1 via an arbitrary transmitting medium in the network.

Figure 4:
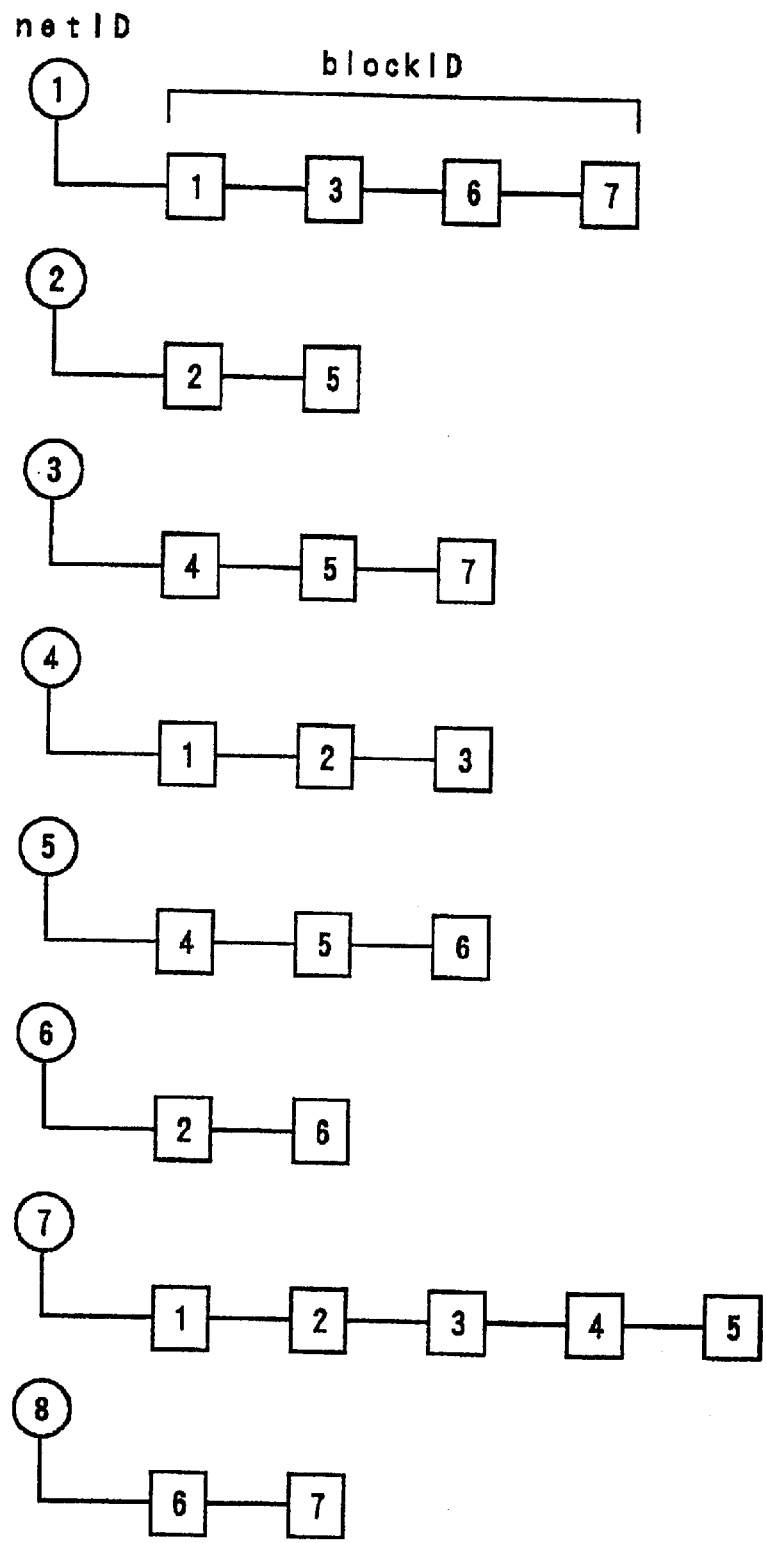
FIG. 4 shows an example of a net list table.

FIG. 3 shows an example of the table data of the block table 20, and FIG. 4 shows an example of the table data of the net list table 21.

The block table 20 shown in FIG. 3 manages the area of an LSI block, the number of nets wired in the LSI block, a flag indicating whether the LSI block is of fixed shape (fixed shape flag), and also the size (x, y) and a rotation code (code indicating the layout direction of an LSI block of fixed shape), which indicates the orientation in the case of an LSI block of fixed shape in relation to the ID of an LSI block to be processed by the LSI floor plan determination program 22.

As shown in FIG. 4, the net list table 21 manages the ID of an LSI block connected to the net in relation to the ID of a net connected to a plurality of LSI blocks. For example, the net list table 21 indicates that an LSI block connected to a net the net ID of which is "1", are LSI blocks "1", "3", "6" and "7".

Figure 5:
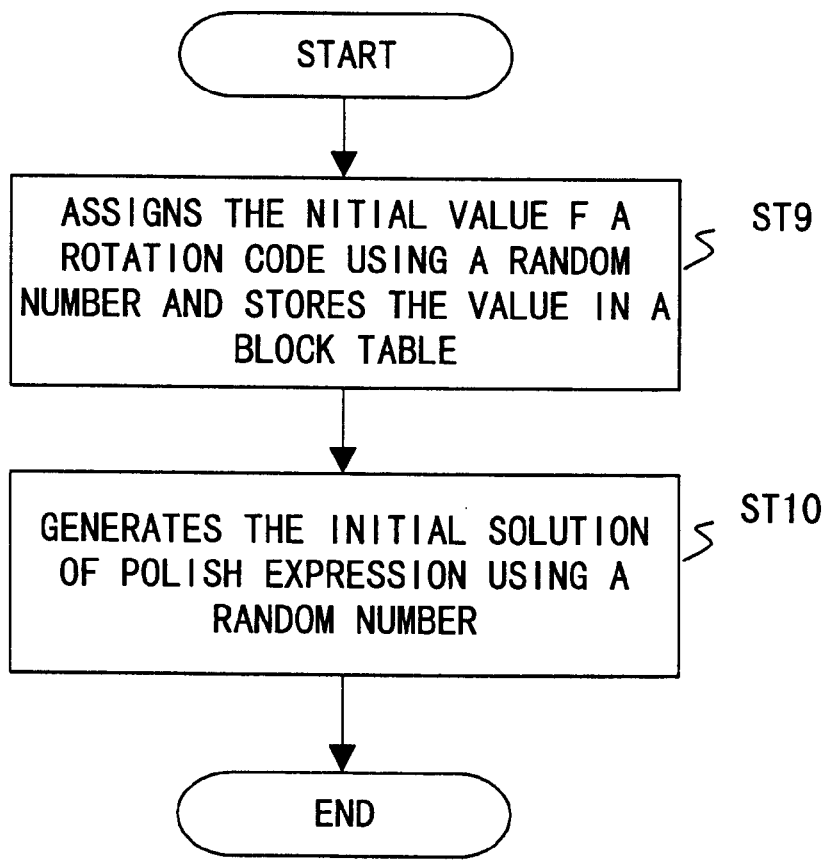
FIG. 5 is a flowchart showing the process of an initialization process execution program.
Figure 6:
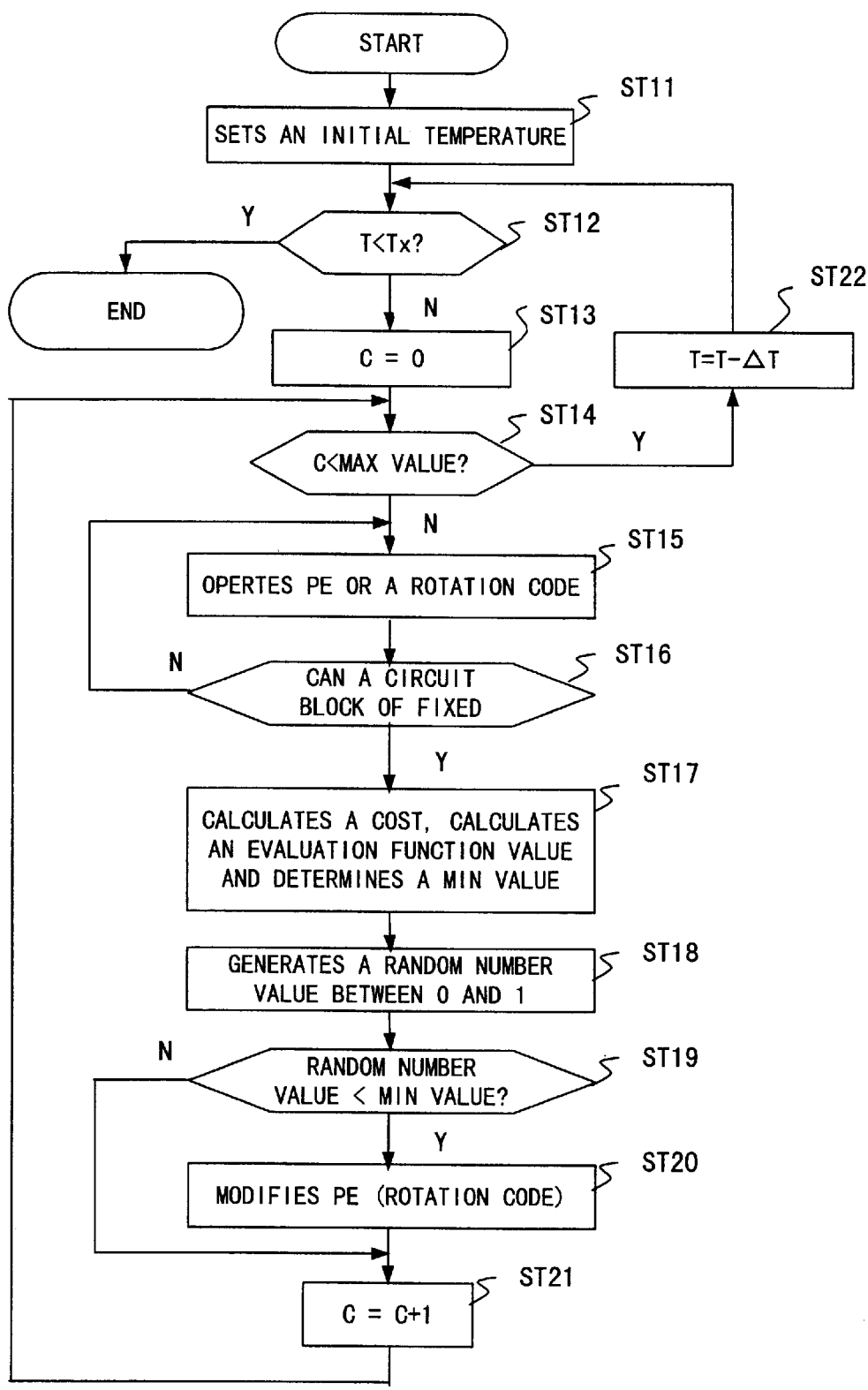
FIG. 6 is a flowchart showing the process of an LSI floor plan determination program.

FIG. 5 is an example of a flowchart showing a process of executing the initialization process execution program 23, and FIGS. 6 and 7 are examples of a flowchart showing the process of the LSI floor plan determination program 22. Next, the LSI floor plan determination process implemented by the present invention is described in detail according to these flowcharts.

When being started, as shown in FIG. 5, first in step ST9, the initialization process execution program 23 processes LSI blocks of fixed shape stored in the block table 20, generates the initial value of a rotation code that is assigned to an LSI block of fixed shape using a random number and writes the values in the entry area of a corresponding rotation code in the block table 20.

For example, as shown in FIG. 3, a rotation code initial value "1" is assigned to an LSI block of fixed shape "1" and a rotation code initial value "3" is assigned to an LSI block of fixed shape "5".

Then, in step ST10, the initialization process execution program 23 generates the initial solution of Polish expression, which is the initial solution of an LSI floorplan, using the IDs of LSI blocks stored in the block table 20 and a random number.

For example, the following initial solution of Polish expression, as shown in FIG. 1B, is generated.

16+35*2+74+**

In this way, when being started, the initialization process execution program 23 generates the initial solution of Polish expression, which is the initial solution of an LSI floor plan, and simultaneously assigns the initial value of a rotation code, which indicates the orientation, to an LSI block of fixed shape described by the Polish expression.

After the initialization process of this initialization process execution program 23 is completed, the LSI floor plan determination program 22 determines an optimal LSI floor plan according to the flowchart shown in FIG. 6.

Specifically, when being started, as shown in FIG. 6, first in step ST11 the LSI floor plan determination program 22 sets an initial temperature T defined in SA. Then, in step ST12 the LSI floor plan determination program 22 judges whether temperature T is smaller than a stipulated termination temperature Tx. If it is judged that temperature T is smaller than termination temperature Tx, the LSI floor plan determination program 22 terminates the process when the optimal solution of Polish expression is obtained.

If it is judged that temperature T is larger than the stipulated termination temperature Tx, the flow proceeds to step ST13 and the LSI floor plan determination program 22 sets a counter value C to 0. Then, in step ST14, the LSI determination program 22 judges whether the counter value exceeds the stipulated maximum value. If it is judged that counter value C does not exceed the maximum value, the flow proceeds to step ST15 and operates Polish expression or the rotation code assigned to an LSI block of fixed shape.

For example, as shown in FIG. 7, in step ST15, the LSI floor plan determination program 22 generates random numbers the values of which are 0, 1 and 2 (step ST30). If the random number value is 0 (step ST31), the LSI floor plan determination program 22 exchanges two adjacent operands of Polish expression (the operands are separately selected using a random number, etc.) (step ST32). If the random number value is 1 (step ST33), the LSI floor plan determination program 22 makes a complement of an operator in a specific part of Polish expression (the part to be processed is separately determined using a random number, etc.) (step ST34). If the random number value is 2, the LSI floor plan determination program 22 modifies a rotation code assigned to an LSI block of fixed shape (the LSI blocks is separately selected using a random number, etc.) (the value of a rotation code to be modified is separately determined using a random number, etc.) (step ST35).

For the process of exchanging operands, a process of making the complement of operators and a process of modifying a rotation code are provided with functions to execute the respective processes, and each process can be executed by calling up the respective function.

Although in FIG. 7, the operation of exchanging operands, making a complement of an operator or modifying a rotation code is executed, the combined operation of exchanging operands and modifying a rotation code or making a complement of an operator and modifying a rotation code can also be executed.

Then, instep ST16, the LSI floor plan determination program 22 judges whether an LSI block of fixed shape cannot be laid out in an LSI floor plan specified by Polish expression which is transformed by the operation in step ST15 (which is judged from the size and posture designated by the rotation code). If it is judged that the layout is not available, the flow returns to step ST15, and the LSI floor plan determination program 22 subsequently operates Polish expression or a rotation code assigned to the LSI block of fixed shape.

Specifically, unlike the prior art which takes into consideration only the area of an LSI block, this preferred embodiment is configured to assign a rotation code, which indicates the orientation, to an LSI block of fixed shape. If an LSI block of fixed shape cannot be laid out in an LSI floor plan specified by Polish expression, the Polish expression is transformed by operating the rotation code and it is judged whether the LSI block of fixed shape can be laid out. If it is judged that the layout is not available, the Polish expression is not adopted, the flow returns to step ST15 and a subsequent Polish expression is generated.

If in step ST16 it is judged that the LSI block of fixed shape is available, the flow proceeds to step ST17, the LSI floor plan determination program 22 calculates both the cost Cost(S) of an LSI floor plan specified by Polish expression obtained before the operation and the cost Cost(S') of the LSI block of fixed shape specified by Polish expression obtained after the operation. Then, the LSI floor plan determination program 22 calculates the following evaluation function value $$e^{-[Cost(S')-Cost(S)]/T}$$

and determines a min value defined as follows.

$$\min(1, e^{-[Cost(S')-Cost(S)]/T})$$

For the cost, for example, a wiring cost which is defined by the total value of the sum of intra-block wire lengths of each LSI block and the sum of inter-block wire lengths of each net wired among LSI blocks can be used.

The wiring cost (COST1) which is defined as the sum of intra-block wire lengths of each LSI block is, for example, calculated according to the following equation.

COST1=Σhalf-perimeter-intra-block($i$)×$p$×block-intra-net($i$)

In the above equation, "half-perimeter-intra-block(i)", p and "block-intra-net(i)" indicate the wire length of one net wired in an LSI block i, the weight and the number of nets wired in the LSI block i (the number of intra-nets registered in the block table 20), respectively.

Figure 8A:
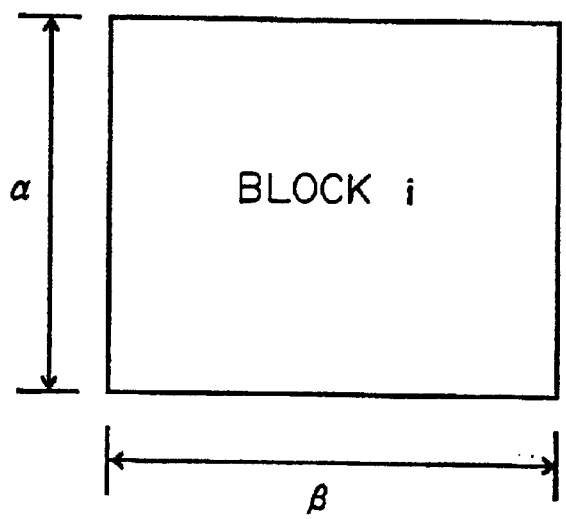
FIG. 8A shows the first cost calculation.

As shown in FIG. 8A, "half-perimeter-intra-block(i)" is, for example, obtained by adding a vertical length and a horizontal length of LSI block i laid out in an LSI floor plan specified by Polish expression. It goes without saying that the "half-perimeter-intra-block(i)" of an LSI block of fixed shape is the total value of a vertical length and a vertical length which are registered in the block table 20.

The wiring cost (COST2), which is defined as the sum of inter-block wire lengths of each net wired among LSI blocks, is, for example, calculated according to the following equation.

COST2=Σhalf-perimeter-inter-block($j$)

Figure 8B:
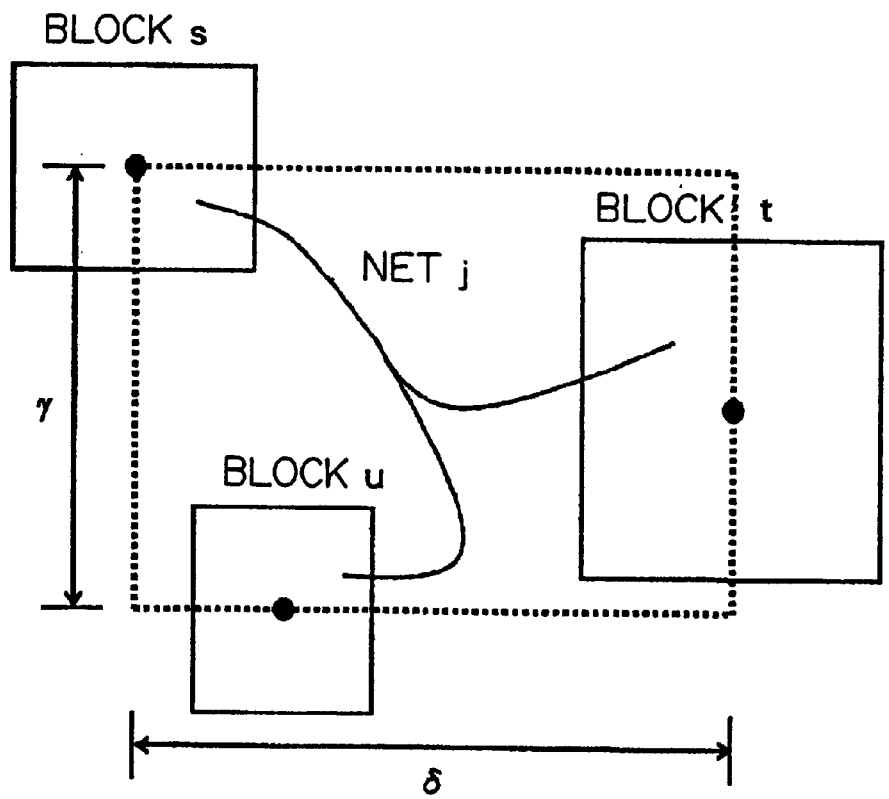
FIG. 8B shows the second cost calculation.

In the above equation, "half-perimeter-inter-block(j)" is the wire length of net j and as shown in FIG. 8B, the length is obtained by adding the vertical length and horizontal length of a rectangle, completely including the center of an LSI block connected to a net j. In this case, if net j is connected to the terminal of an LSI block of fixed shape, it is preferable to determine the rectangle using the actual terminal position instead of the center of the LSI block. The LSI block to which each net is connected an be obtained by referring to the net list table 21.

Furthermore, as the wiring cost the following sum of penalty values which are defined by assigning 1 if the wire length of net j obtained by "half-perimeter-inter-block(j)" exceeds "net-length(j)" designated by a user and assigning 0 if the wire length of net j does not exceed the "net-length(j)" can also be added in addition to the total value of the wiring cost (COST1) and wiring cost (COST2).

COST3=Σlength-violation($j$)×$q$

However, in the above equation, q indicates a weight.

Figures 9, 10:
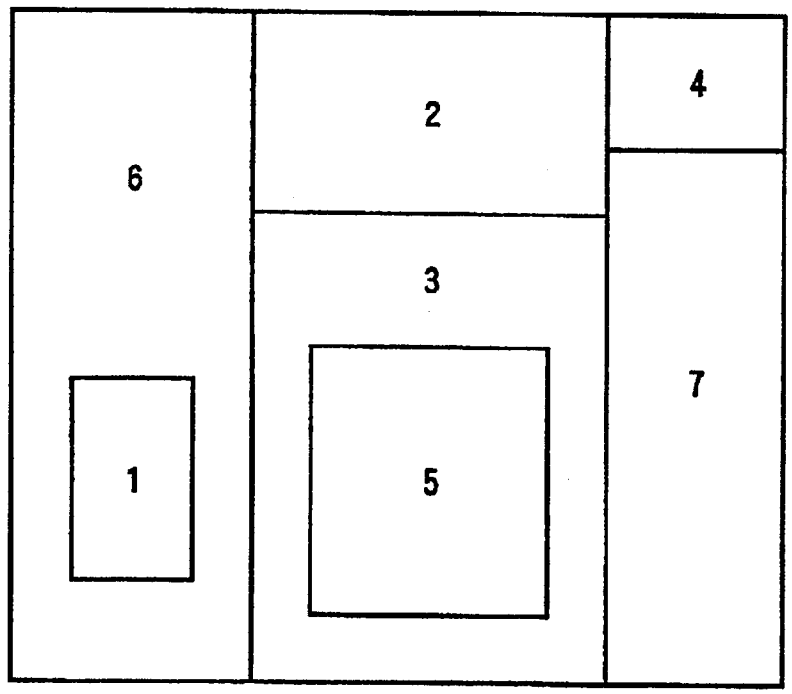
FIG. 9 shows a net table.
FIG. 10 shows another preferred embodiment of the present invention.

Specifically, a net table for managing "net-length(j)" as shown in FIG. 9 can also be prepared by consulting with a user, and the sum of penalty values which are defined by assigning 1 if the wire length of net j obtained by "half-perimeter-inter-block(j)" exceeds this "net-length(j)" and assigning 0 if the wire length does not exceed the "net-length(j)" can also be added to the wiring cost.

If the wiring cost (COST3) which is defined as the sum of these penalty values is used, an LSI floor plan can be optimized in such a way that a net with a critical timing can be included as much as possible in a designated wire length by resulting in a high cost if the net is included in the designated wire strength.

In this case, it is also possible to not use the total value of the wiring cost (COST1) defined as the sum of intra-block wire lengths, the wiring cost (COST2) defined as inter-block wire lengths and the wiring cost (COST3) defined as the sun of penalty values as a final wiring cost, but to use only the wiring cost (COST3) defined as the sum of penalty values as the final wiring cost.

If we return to the description of the flowchart shown in FIG. 6, in step ST17 the Cost (S) of an LSI floor plan specified by Polish expression before the operation and the Cost (S') of an LSI floor plan specified by Polish expression after the operation are calculated, then the following evaluation function value is calculated $$e^{-[Cost(S')-Cost(S)]/T}$$

and a min value can be defined as follows.

$$\min(1, e^{-[Cost(S')-Cost(S)]/T})$$

Then, in step ST18, a random number value which is between 0 and 1 is generated.

Then, in step ST19 it is judged whether the generated random number value is smaller than the min value determined in step ST17. If the value is judged to be smaller, the flow proceeds to step ST20 and Polish expression (rotation code) is modified by assigning the Polish expression (rotation code) after the operation as a new Polish expression (rotation code). If the value is judged to be larger, the process in step ST20 is not executed, Polish expression (rotation code) is not modified and the Polish expression (rotation code) before the operation is validated.

Then, in step ST21, counter value C is incremented by one, and the flow returns to step ST14.

If in step ST14 it is judged that a repetition process is executed by a prescribed number of times when the modification of Polish expression is repeated at temperature T to be set by repeating the processes in steps ST14 and ST22, the flow proceeds to step ST22, the temperature T is reduced by a prescribed temperature and the flow returns to step ST12. In this way, Polish expression is repeated at a temperature lower than the previous time.

If in step ST12 it is judged that the temperature T is reduced lower than a stipulated termination temperature Tx when this repetition process is continued, it is judged that the final solution of Polish expression is obtained and the process is terminated.

In this way, the LSI floor plan determination program 22 determines an LSI floor plan according to the optimization algorithm of SA, controlling both the fixed shape and layout orientation of an LSI block of fixed shape.

Next, another preferred embodiment of the present invention is described.

As shown in FIG. 10, in this preferred embodiment, an LSI floor plan is determined by executing SA, including LSI blocks of fixed shape ("1" and "5" in FIG. 10) in any of LSI blocks of non-fixed shape and also operating the parent LSI block.

According to this preferred embodiment, although the shape of the LSI block of fixed shape is not necessarily guaranteed in a determined floor plan, the LSI block of fixed shape is merged with one of the LSI blocks of non-fixed shape. Therefore, there is a high possibility that the shape may be guaranteed in the large merged area. Accordingly, there is a very high possibility of determining a valid LSI floor plan.

FIG. 11 shows an example of the table data of a block table 20 used in this preferred embodiment.

The block table of this preferred embodiment manages the area of an LSI block, the number of nets wired in the LSI block, a flag (fixed shape flag) indicating whether the LSI block is of fixed shape and in the case of an LSI block of fixed shape, also the ID of a parent LSI block to which the LSI block of fixed shape belongs in relation to the ID of the LSI block to be processed by the LSI floor plan determination program 22.

FIG. 12 shows an example of a flowchart showing a process of the initialization execution program 23 of this preferred embodiment, and FIGS. 13 and 14 show examples of flowcharts showing the process of the LSI floor plan determination program 22 of this preferred embodiment. Next, the determination process of this preferred embodiment is described in detail.

When being started, as shown in FIG. 12, first in step ST41 the initialization execution program 23 targets LSI blocks of fixed shape stored in the block table 20, generates the initial values of the IDs of the parent LSI blocks that are assigned to LSI blocks of fixed shape using a random number (it is preferable for the values not to be overlapped) and writes the values into the entry area of a corresponding parent LSI block ID in the block table 20.

For example, as shown in FIG. 11, the initialization execution program 23 assigns the initial value "6" of the parent LSI block ID to an LSI block of fixed shape "1", and assigns the initial value "3" of the parent LSI block ID to an LSI block of fixed shape "5".

Then, in step ST42, the initialization execution program 23 excludes LSI blocks of fixed shape from the target and generates the initial solution of Polish expression, which is the initial solution of the LSI floor plan, using both the ID of the LSI block stored in the block table 20 and a random number. For example, the initialization execution program 23 generates the following initial solution of Polish expression which specifies the floor plan shown in FIG. 10.

632+*74+*

In this case, the area of anLSI block "6" is the total value of the own area of LSI block "6" and the area of an LSI block of fixed shape "1" included in the LSI block. The area of an LSI block "3" is the total value of the own area of LSI block "3" and the area of an LSI block of fixed shape "5" included the LSI block.

Furthermore, the number of intra-block nets of LSI block "6" is the total value of the own number of intra-block nets of the LSI block "6", the number of intra-block nets of the LSI block of fixed shape "1" included the LSI block "6" and the number of nets which connect the LSI blocks of fixed shape "6" and LSI block of fixed shape "1". The number of intra-block nets of LSI block "3" is the total value of the own number of LSI block "3", the intra-block nets of LSI block of fixed shape "5" included in the LSI block "3" and the number of nets which connect the LSI block "3" and LSI block of fixed shape "5".

In this way, when being started, the initialization execution program 23 assigns the ID of a parent LSI block, including the LSI block, to LSI blocks of fixed shape, excludes the LSI blocks of fixed shape from the process target and generates the initial solution of Polish expression, which is the initial solution of the LSI floor plan.

After the initialization process of this initialization execution program 23 is completed, the LSI floor plan determination program 22 determines an optimal LSI floor plan according to the flowchart shown in FIG. 13.

Specifically, when being started, as shown in FIG. 13, first in step ST51 the LSI floor plan determination program 22 sets an initial temperature T defined by SA. Then, in step ST52, it is judged whether the the temperature T is lower than the stipulated termination temperature Tx. If the value is judged to be lower, the LSI floor plan determination program 22 terminates the process when an optimal solution of Polish expression is obtained.

If the temperature T is judged to be higher than the stipulated termination temperature Tx, the flow proceeds to step ST53 and sets counter value C to 0. Then, in step ST 54 it is judged whether the counter value C exceeds a prescribed maximum value. If it is judged that i does not exceeds the value, the flow proceeds to step ST55 and the LSI floor plan determination program operates Polish expression or the ID of a parent LSI block to which the LSI block of fixed shape belongs.

For example, as shown in FIG. 14, in step ST55 the LSI floor plan determination program 22 generates a random number which takes 0, 1 and 2 as its value (step ST70). If the random number value is 0 (step ST71), the LSI floor plan determination program 22 exchanges two adjacent operands of Polish expression (the operands are separately selected using a random number, etc.). If the random number value is 1 (step ST72), the LSI floor plan determination program 22 makes a complement of an operator in a specific part of Polish expression (the part to be processed is separately determined using a random number, etc.) (step ST74). If the random number value is 2, the LSI floor plan determination program 22 modifies the ID of a parent LSI block which is assigned to the LSI block of fixed shape (the LSI block of fixed shape is separately selected using a random number, etc.) (step ST75).

In this case, if the ID of a parent LSI block is modified, both the area/number of intra-block nets of the old parent LSI block and the area/number of intra-block nets of a new parent LSI block are modified.

Although in FIG. 14, operands are exchanged, a complement of operators is made or the ID of a parent LSI block is modified, the exchange of operands and the modification of the ID of a parent LSI block can also be combined or the making of a complement of operators and the modification of the ID of a parent LSI block can also be combined.

Then, in step ST56, both the cost Cost(S) of the LSI floor plan specified by Polish expression before the operation and the cost Cost(S') of the LSI floor plan specified by Polish expression after the operation are calculated, the following evaluation function value is calculated $$e^{-[Cost(S')-Cost(S)]/T}$$

and a min value defined as follows is determined.

$$\min(1, e^{-[Cost(S')-Cost(S)]/T})$$

For the cost used in this case, for example, the total value of the wiring cost (COST1) defined as the sum of LSI intra-block wire lengths described earlier and the wiring cost (COST2) defined as the sum of LSI inter-block wire lengths is used.

Then, in step ST57, a random number value between 0 and 1 is generated, and in step ST58, it is judged whether the generated random number value is smaller the determined min value.

If it is judged from this judgment process that the generated random number value is smaller than the determined min value, the flow proceeds to step ST59 and Polish expression (parent LSI block ID) is modified by designating Polish expression (parent LSI block ID) after the operation as a new Polish expression (parent LSI block ID). If the value is judged to be larger, the process in step ST59 is not executed, Polish expression (parent LSI block ID) is not modified and Polish expression (parent LSI block ID) before the operation is validated.

Then, in step ST60, the counter value C is incremented by one, and the flow returns to step ST54.

If in step ST54 it is judged that the prescribed number of times of the repetition process has been executed when the modification of Polish expression is repeated at temperature T to be set by repeating the processes in steps ST54 and ST60, the flow proceeds to step ST61, the modification of Polish expression is repeated at a temperature lower than the previous time by reducing the temperature T by the prescribed temperature and by the flow returning to step ST52.

If in step ST61 it is judged that the temperature T is lower than the stipulated termination temperature TX when this repetition process is continued, the LSI floor plan determination program 22 judges that the optimal solution of Polish expression has been obtained and terminates the process.

In this way, the LSI floor plan determination program 22 controls in such a way that an LSI block of fixed shape can be merged with an LSI block of non-fixed shape and determines an LSI floor plan according to the optimal algorithm of SA.

Next, another preferred embodiment is described.

As shown in FIG. 15, in this preferred embodiment, when SA is executed, an LSI floor plan is determined without taking into consideration the fixed shape of an LSI block of fixed shape. When the cost of the floor plan is calculated, a cutline is broken in such a way that the LSI block of fixed shape can be packed, and the cost is calculated in that state. Packing means to closely lay out LSI blocks.

According to this preferred embodiment, in this way, a high cost is given if an LSI block of fixed shape is packed with the fixed shape maintained, and an LSI floor plan can be optimized in such a way that the fixed shape of the LSI block of fixed shape can be maintained as much as possible.

FIG. 16 shows an example of the table data of a block table 20 used in this preferred embodiment.

The block table 20 of this preferred embodiment manages the area of an LSI block to be processed by the LSI floor plan determination program 22, the number of nets wired in the LSI block, a flag (fixed shape flag) indicating whether the LSI block is of fixed shape, a rotation code which indicates the orientation in the case of an LSI block of fixed shape, packing priority in the case of an LSI block of fixed shape and a packing priority direction in the case of an LSI block of fixed shape in relation to the ID of the LSI block.

This packing priority specifies an order in packing an LSI block of fixed shape. If it is described with reference to FIG. 16, first, an LSI block of fixed shape "1" is packed, then an LSI block of fixed shape "5" is packed.

The packing priority direction specifies the order of a direction of packing. If it is described with reference to FIG. 16, an LSI block of fixed shape "1" is packed in the order of "U L R D" (Upward→Leftward→Rightward→Downward), and an LSI block of fixed shape "5" is packed in the order of "DLRU" (Downward→Leftward→Rightward→Upward)".

Figure 18:
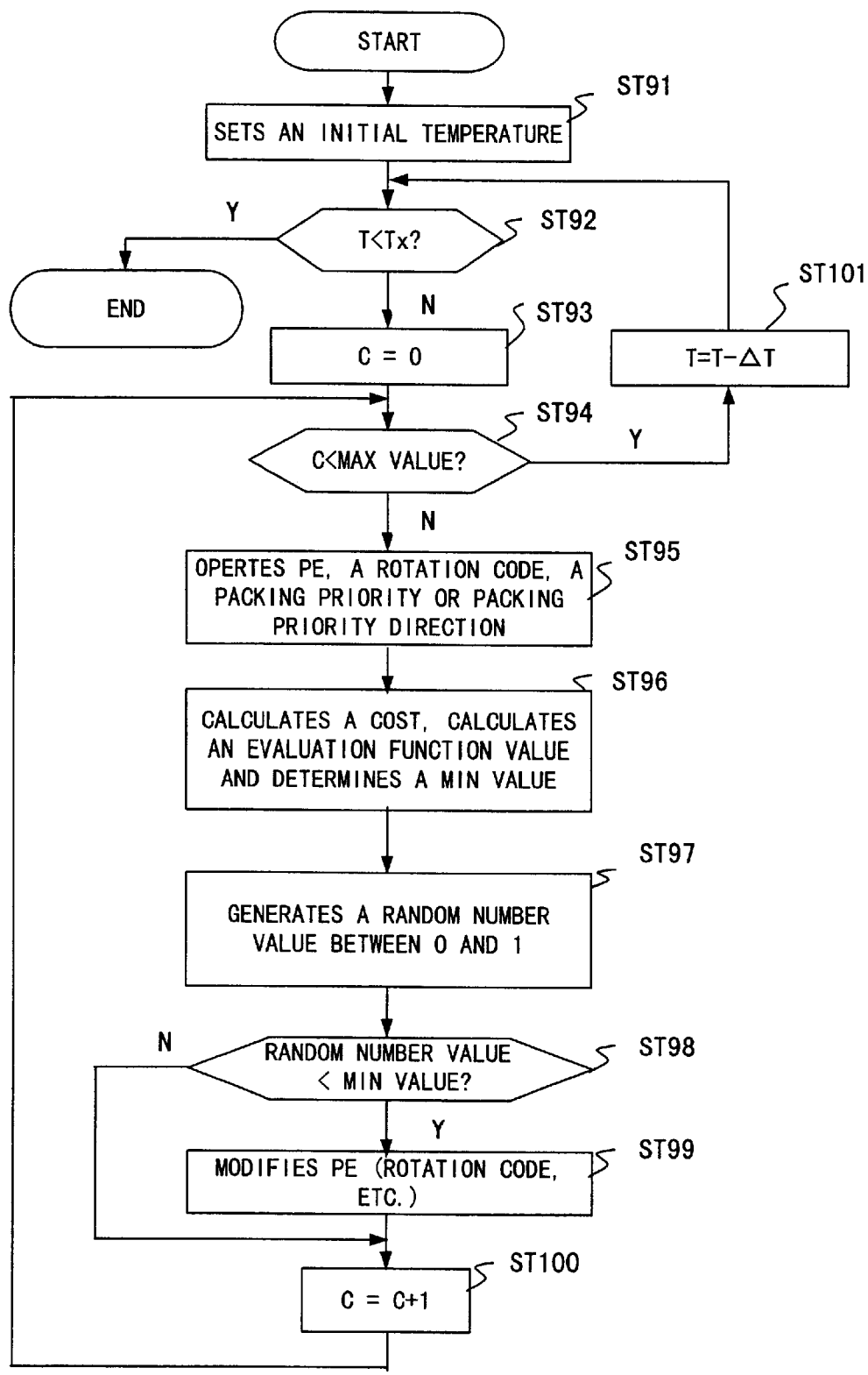
FIG. 18 is another flowchart showing the process of an LSI floor plan determination program.

FIG. 17 shows an example of a flowchart showing the process of the initialization execution program 23 of this preferred embodiment, and FIGS. 18 and 20 show examples of a flowchart showing the process of the LSI floor plan determination program 23 of this preferred embodiment. Next, the determination process of an LSI floor plan of this preferred embodiment is described in detail with reference to these flowcharts.

As shown in FIG. 17, when being started, first in step ST81 the initialization execution program 23 targets an LSI block of fixed shape stored in the block table 20, generates the initial value of a rotation code assigned to the LSI block of fixed shape using a random number and writes the value in the entry area of the rotation code in the block table 20.

For example, as shown in FIG. 16, the initial value "1" of a rotation code is assigned to an LSI block of fixed shape "1", and the initial value "3" of a rotation code is assigned to an LSI block of fixed shape.

Then, in step ST82, the initialization execution program 23 targets an LSI block of fixed shape stored in the block table 20, generates the initial value of a packing priority to be assigned to the LSI block of fixed shape using a random number and writes the value in the entry area of a corresponding packing priority in the block table 20.

For example, as shown in FIG. 16, the initial value of the top packing priority is assigned to an LSI block of fixed shape "1", and the initial value of the second packing priority is assigned to an LSI block of fixed shape "5".

Then, in step ST83, the initialization execution program 23 targets an LSI block of fixed shape stored in the block table 20, generates the initial value of a packing priority to be assigned to the LSI block of fixed shape using a random number and writes the value into a corresponding entry area in the block table 20.

For example, as shown in FIG. 16, the initial value of a packing priority direction "ULRD" is assigned to an LSI block of fixed shape "1", and the initial value of a packing priority direction "DLRU" is assigned to an LSI block of fixed shape "5".

Then, in step ST84, the initialization execution program 23 generates the initial solution of Polish expression, which is the initial solution of the LSI floor plan, using both the ID of the LSI block stored in the block table 20 and a random number.

For example, the following initial solution of Polish expression is as shown in FIG. 1B.

16+35*2+74+**

In this way, when being started, the initialization execution program 23 generates the initial solution of Polish expression, which is the initial solution of the LSI block and simultaneously assigns the initial value of a rotation code/packing priority/packing priority to an LSI block of fixed shape which is described in the Polish expression.

After the initialization process of this initialization execution program 23 is completed, the LSI floor plan determination program 22 determines an optimal LSI floor plan according to the flowchart shown in FIG. 18.

Specifically, when being started, as shown in FIG. 18, first in step ST91 the LSI floorplan determination program 22 sets an initial temperature T defined by SA. Then, in step ST92 it is judged whether the temperature T is lower than the stipulated termination temperature Tx. If the value is judged to be lower, the LSI floor plan determination program 22 judges that the optimal solution of Polish expression has been obtained and terminates the process.

If it is judged that the temperature T is larger than the stipulated termination temperature Tx, the flow proceeds to step ST93 and sets the counter value C to 0. Then, in step ST94 it is judged whether the counter value C exceeds a stipulated maximum value. If the value is judged to not exceed the stipulated maximum value, the flow proceeds to step ST95 and operates Polish expression or a rotation code/packing priority/packing priority direction which is assigned to the LSI block of fixed shape.

Figure 19:
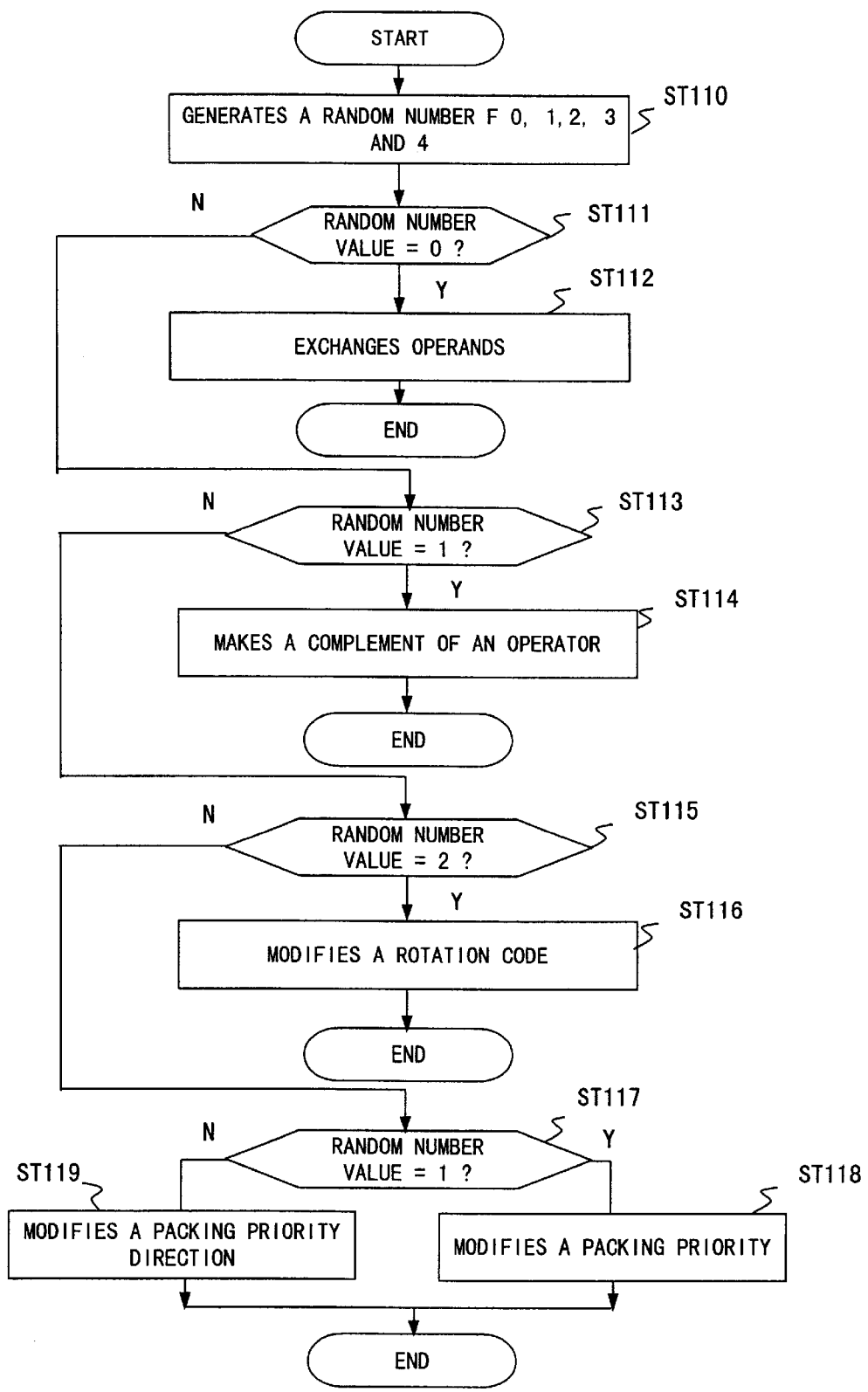
FIG. 19 is another flowchart showing the process of an LSI floor plan determination program.

For example, as shown in FIG. 19, in step ST95 the LSI floor plan determination program 22 generates a random number which takes values of 0, 1, 2, 3 and 4 (step ST110). If the random number value is 0 (step ST111), the LSI floor plan determination program 22 exchanges two adjacent operands of Polish expression (the operands are separately selected using a random number, etc.) (step ST112). If the value is 1 (step ST113), the program 22 makes a complement of an operator in a specific part of Polish expression (the parts to be processed are separately determined using a random number, etc.) (step ST114). If the value is 2 (step ST115), the program 22 modifies a rotation code assigned to an LSI block of fixed shape (the LSI block of fixed shape is separately selected using a random number, etc.) (the value for which the rotation code is modified is separately determined using a random number, etc.) (step ST116). If the value is 3 (step ST117), the program 22 modifies a packing priority assigned to an LSI block of fixed shape (the LSI block of fixed shape is separately selected using a random number, etc.) (the value for which the packing priority is modified is separately determined using a random number, etc.) (step ST118). If the value is 4, the program 22 modifies a packing priority direction assigned to an LSI block of fixed shape (the LSI block of fixed shape is separately selected using a random number, etc.) (the value for which the packing priority direction is modified is separately determined using a random number, etc.) (step ST119).

For the process of exchanging operands, process of making a complement of an operator, process of modifying a rotation code, process of modifying a packing priority and process of modifying a packing priority direction, functions are provided to execute the respective processes, and each process can be executed by calling up the respective function.

Although in FIG. 19, the operation of exchanging operands, making a complement of an operator, modifying a rotation code, modifying a packing priority or modifying a packing priority direction is executed, these operations can also be combined and executed.

Then, in step ST96, the LSI floor plan determination program 22 calculates both the cost Cost(S) of an LSI floor plan specified by Polish expression before the operation and the cost Cost(S') of the LSI block of fixed shape specified by Polish expression after the operation. Then, the LSI floor plan determination program 22 calculates the following evaluation function value $$e^{-[Cost(S')-Cost(S)]/T}$$

and determines a min value defined as follows.

$$\min(1, e^{-[Cost(S')-Cost(S)]/T})$$

For the cost used in this case, for example, a wiring cost which is defined by the total value of the sum of LSI intra-block wire lengths and the sum of LSI inter-block wire lengths is used.

When this cost is calculated, it is judged whether an LSI block of fixed shape can be packed in an area specified by Polish expression after the operation. If it is judged that the block cannot be packed, the packing is realized by breaking a cutline which divides the LSI block, and the cost is calculated in that state.

Specifically, when the flow proceeds to step ST96 after in step ST95 Polish expression is operated, as shown in FIG. 20, first in step ST120 it is judged whether all LSI blocks of fixed shape are selected. If it is judged that all the blocks are not selected, the flow proceeds to ST121 and of unselected LSI blocks of fixed shape, the one with the top priority is selected according to the assigned packing priority.

Then, instep ST122, the selected LSI block of fixed shape is attempted to be packed in an area specified by Polish expression after the operation, based on a rotation code and packing priority direction which are assigned to the selected LSI block of fixed shape.

Then, in step ST123 it is judged whether the LSI block of fixed shape can be packed by the packing process. If it is judged that the block has not been packed, the flow proceeds to step ST124, and of unbroken cutlines (lines for separating an LSI block), the one in the lowest level is subsequently broken until the block is packed.

A description is given with reference to FIG. 15. For example, if an LSI block of fixed shape "1" cannot be packed in an area specified by Polish expression, the LSI block of fixed shape "1" can be packed by breaking a cutline L1 which separates the block from an LSI block of non-fixed shape "6". If an LSI block of fixed shape "5" cannot be packed in an area specified by Polish expression, the LSI block of fixed shape "5" can be packed by breaking a cutline L2 which separates the block from an LSI block of non-fixed shape "3".

The reason that a cutline in the lowest level is broken is because the layout form of an LSI floor plan specified by Polish expression must be deformed as little as possible.

If the process in step ST124 is completed, the flow returns to step ST120. If in step ST123 it is judged that the packing is implemented, the flow returns to step ST120 without the execution of the process in step ST124.

If in step ST120 it is judged that all the LSI blocks of fixed shape are selected, the flow proceeds to ST125, and both the cost Cost(S) of an LSI floor plan specified by Polish expression before the operation and the cost Cost(S') of the LSI block of fixed shape specified by Polish expression after the operation are calculated.

Then, as described earlier, in step ST96 shown in FIG. 18, the following evaluation function value is Calculated $$e^{-[Cost(S')-Cost(S)]/T}$$

and a min value defined as follows is determined.

$$\min(1, e^{-[Cost(S')-Cost(S)]/T})$$

As known from the floor plan shown in the lower section of FIG. 15, if a cutline is broken, the shape of an LSI block separated by the broken cutline ceases to be rectangular. Therefore, the wiring costs COST1 and COST2 described earlier of the non-rectangular LSI block are calculated, for example, by transforming the shape to a rectangle according to a proper algorithm or only the wiring cost COST2 described earlier is calculated by calculating the center of gravity of the non-rectangle and using the center of gravity instead of the rectangle.

We return to the description on FIG. 18. If in step ST96, both the cost Cost(S) of an LSI floor plan specified by Polish expression before the operation and the cost Cost(S') of the LSI block of fixed shape specified by Polish expression after the operation are calculated, the following evaluation function value is calculated $$e^{-[Cost(S')-Cost(S)]/T}$$

and the min value defined as follows is determined min(1, $e^{-[Cost(S')-Cost(S)]/T}$). Then, in step ST97, a random number value between 0 and 1 is generated.

Then, in step ST98 it is judged whether the generated random number value is smaller than the min value determined in step ST96. If it is judged that the value is smaller, the flow proceeds to step ST99 and Polish expression (rotation code/packing priority/packing priority direction) is modified by designating Polish expression (rotation code/packing priority/packing priority direction) after the operation as a new Polish expression (rotation code/packing priority/packing priority direction). If it is judged that the value is larger, the process in ST100 is not executed, Polish expression (rotation code/packing priority/packing priority direction) before the operation is validated and Polish expression (rotation code/packing priority/packing priority direction) is not modified.

Then, in step ST100, the counter value C is incremented by one and the flow returns to step ST94.

If in step ST94 it is judged that are petition process is executed by a prescribed number of times when the modification of Polish expression is repeated at temperature T to be set by repeating the processes steps ST94 and ST100, the flow proceeds to step ST101, the temperature T is reduced by a prescribed temperature and the flows returns to step ST92. In this way, Polish expression is repeated at a temperature lower than the previous time.

If in step ST92 it is judged that the temperature T is reduced below a stipulated termination temperature Tx when this repetition process is continued, it is judged that the final solution of Polish expression is obtained and the process is terminated.

In this way, when SA is executed, the LSI floor plan determination program 22 determines an LSI floor plan, taking into consideration the fixed shape of an LSI block of fixed shape, and when the cost of the floor plan is calculated, a cutline is broken in such a way that the LSI block of fixed shape can be packed. The cost is calculated in that state.

In this way, according to this preferred embodiment, a high cost is given since an LSI block of fixed shape is packed as the fixed shape is maintained, and an LSI floor plan is optimized in such a way that the LSI block of fixed shape can be laid out as the fixed shape is maintained as much as possible.

The LSI floor plan determination program 22 is sometimes configured to perform control in such a way that the LSI block of fixed shape can be laid out so as to maintain the fixed shape as much as possible, by operating an LSI block located lower than the broken cutline in a tree level.

Figure 21:
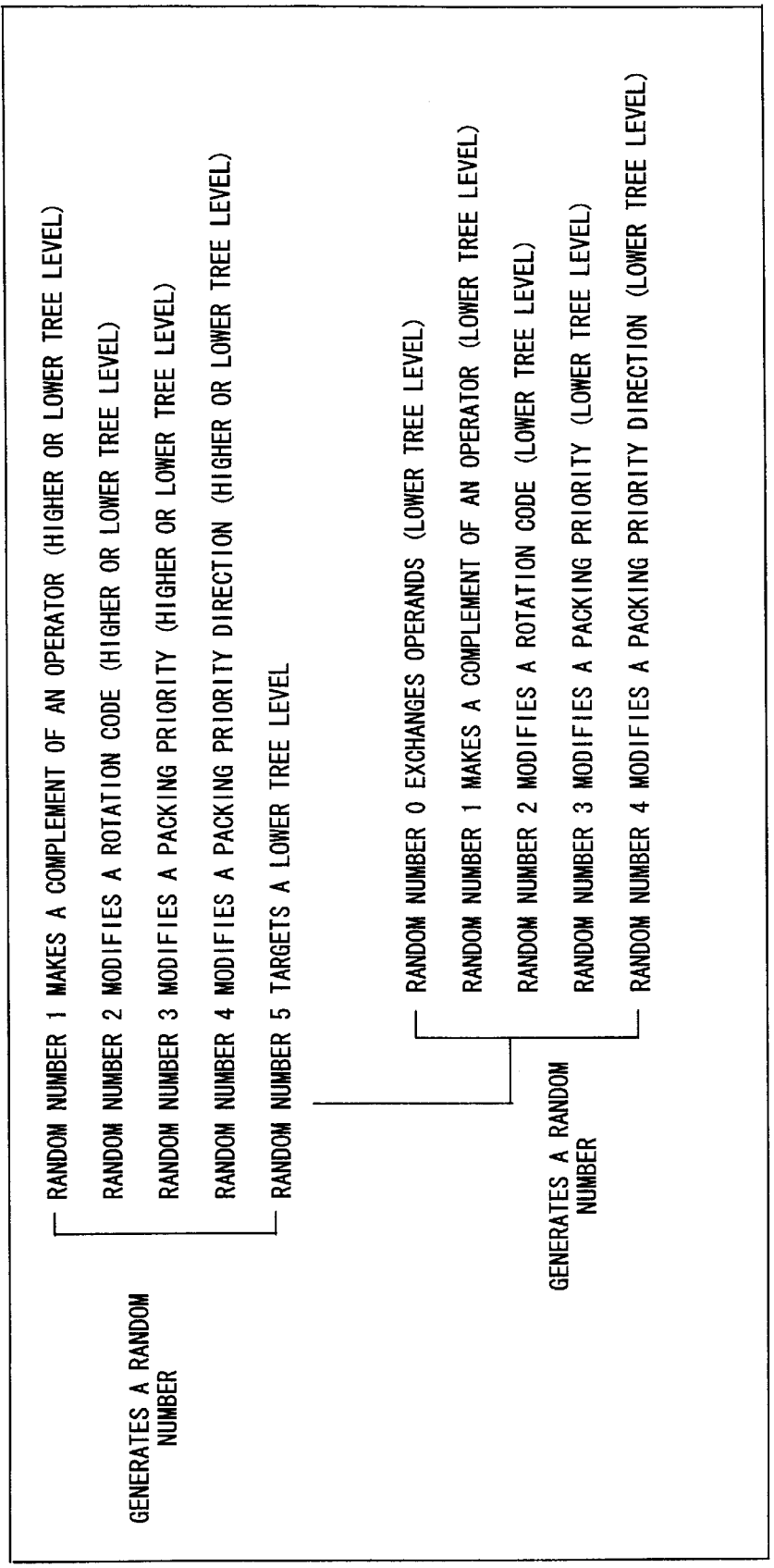
FIG. 21 shows another embodiment of the present invention.

In this configuration, for example, as shown in FIG. 21, first, a random number which takes 0, 1, 2, 3, 4 and 5 is generated. If the random number value is 0, two adjacent operands of Polish expression are exchanged. If the value is 1, a complement of an operator in a specific part of Polish expression is made. If the value is 2, a rotation code to be assigned to an LSI block of fixed shape is modified. If the value is 3, a packing priority to be assigned to the LSI block of fixed shape is modified. If the value is 4, a packing priority direction to be assigned to the LSI block of fixed shape is modified. If the value is 5, an LSI block located lower than the broken cutline in a tree level is targeted.

If a random number 5 is generated in the first random number generation, a random number which takes 0, 1, 2, 3 and 4 is generated next. If the random number value is 0, an LSI block located lower than the broken cutline in a tree level is targeted and two adjacent operands of Polish expression are exchanged. If the value is 1, an LSI block located lower than the broken cutline in a tree level is targeted and a complement of an operator in a specific part of Polish expression is made. If the value is 2, an LSI block located lower than the broken cutline in a tree level is targeted and a rotation code to be assigned to an LSI block of fixed shape is modified. If the value is 3, an LSI block located lower than the broken cutline in a tree level is targeted and a packing priority to be assigned to the LSI block of fixed shape is modified. If the value is 4, an LSI block located lower than the broken cutline in a tree level is targeted and a packing priority direction to be assigned to the LSI block of fixed shape is modified.

The LSI blocks which are operated by the random number generated in the first time are both LSI blocks located higher than the broken cutline in a tree level and LSI blocks located lower than the broken cutline in a tree level, while the LSI blocks which are operated by the random number generated in the second time are only LSI blocks located lower than the broken cutline in a tree level.

In this way, the LSI floor plan determination program 22 can operate LSI blocks located lower than the broken cutline in a tree level.

Although the present invention is described with reference to the preferred embodiments shown in the drawings, the present invention is not limited to these preferred embodiments. Although, in the preferred embodiments, for example, a configuration using SA as an optimization algorithm, the present invention is applicable even when another optimization algorithm is used.

Although the embodiments are configured to automatically generate the initial solution of Polish expression, the system can also be configured in such a way that the initial solution of Polish expression prepared by a user is inputted.

Furthermore, the present invention can be applied not only to an LSI floor plan, but also the floor plan of an arbitrary circuit.

In the way, according to the present invention, the LSI floor plan of an LSI block of fixed shape can be determined in such a way that the fixed shape is not deformed.

In this way, an LSI floor plan can be determined in such a way that an LSI block of fixed shape can be laid out.

According to the present invention, the LSI floor plan can be determined in such a way that an LSI block of fixed shape can be merged with an LSI block of non-fixed shape.

In this way, since an LSI block of fixed shape is merged with an LSI block of non-fixed shape, there is a high possibility of maintaining the fixed shape. Therefore, an LSI floor plan can be determined in such a way that an LSI block of fixed shape can also be laid out.

According to the present invention, an LSI floor plan can be determined in such a way that a high cost is given if an LSI block of fixed shape is laid out as the fixed shape is maintained.

In this way, an LSI floor plan can be determined in such a way that an LSI block of fixed shape can also be laid out.

According to the present invention, an LSI floor plan can be determined in such a way that the wire length can be reduced as much as possible when an LSI block of fixed shape is laid out.

According to the present invention, an LSI floor plan can be determined in such a way that a wiring the timing of which is critical, can be included in a designated wire length when an LSI block of fixed shape is laid out.

What is claimed is:

1. A floor plan determination apparatus, comprising:

an execution device performing one of inputting and generating an initial solution of layout descriptive information that describes a layout of circuit blocks, which is a circuit floor plan in a tree structure having hierarchical partitioning;

an assignment device assigning an initial value of a rotation code indicating an orientation of a circuit block of fixed shape described in the layout descriptive information, to the circuit block of the fixed shape; and a determination device determining the circuit floor plan by repeating a process of operating one of the layout descriptive information and the rotation code on a condition that the circut block of the fixed shape can be laid out, calculating an evaluation value of a floor plan obtained after an operation and judging whether one of the layout descriptive information and the rotation code should be modified, based on the evaluation value.

2. A floor plan determination apparatus, comprising:

an execution device performing one of inputting and generating an initial solution of layout descriptive information that describes a layout of circuit blocks, which is a circuit floor plan;

an assignment device assigning an initial value of a rotation code indicating an orientation of a circuit block of fixed shape described in the layout descriptive information, to the circuit block of the fixed shape; and a determination device determining the circuit floor plan by repeating a process of operating one of the layout descriptive information and the rotation code on a condition that the circuit block of the fixed shape can be laid out, calculating an evaluation value of a floor plan obtained after an operation and judging whether one of the layout descriptive information and the rotation code should be modified, based on the evaluation value, wherein said determination device uses a sum of penalty values calculated based on whether inter-block wire length of each net wiring circuit blocks exceeds a designated wire length, as the evaluation value.

3. The floor plan determination apparatus according to claim 2, wherein said determination device calculates a sum of vertical and horizontal sides of a rectangle, completely including centers of circuit blocks connected to a net, as the inter-block wire length.

4. The floor plan determination apparatus according to claim 3, wherein said determination device specifies the rectangle not using a center of the circuit block of the fixed shape, but using an actual terminal position of the circuit block of the fixed shape.

5. A floor plan determination apparatus, comprising:

an execution device performing one of inputting and generating an initial solution of layout descriptive information that describes a layout of circuit blocks, which is a circuit floor plan;

an assignment device assigning an initial value of a rotation code indicating an orientation of a circuit block of fixed shape described in the layout descriptive information, to the circuit block of the fixed shape; and a determination device determining the circuit floor plan by repeating a process of operating one of the layout descriptive information and the rotation code on a condition that the circuit block of the fixed shape can be laid out, calculating an evaluation value of a floor plan obtained after an operation and judging whether one of the layout descriptive information and the rotation code should be modified, based on the evaluation value, wherein said determination device uses a total value of a sum of intra-block wire lengths of circuit blocks and a sum of inter-block wire lengths of nets wiring circuit blocks, as the evaluation value.

6. The floor plan determination apparatus according to claim 5, wherein said determination device calculates a value from a result of multiplying a sum of vertical and horizontal sides of a circuit block by a number of nets in the circuit block, as one of the intra-block wire lengths.

7. A floor plan determination apparatus, comprising:

an execution device performing one of inputting and generating an initial solution of layout descriptive information that describes a layout of circuit blocks, which is a circuit floor plan;

an assignment device assigning an initial value of a rotation code indicating an orientation of a circuit block of fixed shape described in the layout descriptive information, to the circuit block of the fixed shape; and a determination device determining the circuit floor plan by repeating a process of operating one of the layout descriptive information and the rotation code on a condition that the circuit block of the fixed shape can be laid out, calculating an evaluation value of a floor plan obtained after an operation and judging whether one of the layout descriptive information and the rotation code should be modified, based on the evaluation value, wherein said determination device uses a total value of a sum of intra-block wire lengths of circuit blocks, a sum of inter-block wire lengths of nets wiring circuit blocks and a sum of penalty values calculated based on whether one of the inter-block wire lengths exceeds a designated wire length, as the evaluation value.

8. A floor plan determination method, comprising:

generating an initial solution of layout descriptive information that describes a layout of circuit blocks, which is a circuit floor plan in a tree structure having hierarchical partitioning;

assigning an initial value of a rotation code indicating an orientation of a circuit block of fixed shape described in the layout descriptive information, to the circuit block of the fixed shape; and determining the floor plan by repeating a process of operating one of the layout descriptive information and the rotation code on a condition that the circuit block of the fixed shape described in the layout descriptive information can be laid out, calculating an evaluation value of a floor plan obtained after an operation and judging whether one of the layout descriptive information and the rotation code should be modified, based on the evaluation value.

9. A computer-readable storage medium on which is recorded a program for enabling a computer to execute a process, said process comprising:

generating an initial solution of layout descriptive information that describes a layout of circuit blocks, which is a circuit floor plan in a tree structure having hierarchical partitioning;

assigning an initial value of a rotation code indicating an orientation of a circuit block of fixed shape described in the layout descriptive information, to the circuit block of the fixed shape; and determining the floor plan by repeating a process of operating one of the layout descriptive information and the rotation code on a condition that the circuit block of the fixed shape described in the layout descriptive information can be laid out, calculating an evaluation value of a floor plan obtained after an operation and judging whether one of the layout descriptive information and the rotation code should be modified, based on the evaluation value.

10. A propagating signal for transmitting to a computer a program for enabling the computer to execute a process, said process comprising:

generating an initial solution of layout descriptive information that describes a layout of circuit blocks, which is a circuit floor plan in a tree structure having hierarchical partitioning;

assigning an initial value of a rotation code indicating an orientation of a circuit block of fixed shape described in the layout descriptive information, to the circuit block of the fixed shape; and determining the floor plan by repeating a process of operating one of the layout descriptive information and the rotation code on a condition that the circuit block of the fixed shape described in the layout descriptive information can be laid out, calculating an evaluation value of a floor plan obtained after an operation and judging whether one of the layout descriptive information and the rotation code should be modified, based on the evaluation value.

11. A method, comprising:

generating a tree structure having hierarchical partitioning providing a layout solution for circuit blocks of a circuit layout using layout descriptive information describing a layout of the circuit blocks;

assigning an rotation value of a circuit block;

calculating an evaluation value for the layout solution and rotation value;

determining whether tree and the rotation value should be modified responsive to the evaluation value; and repeating the generating, assigning, calculating and determining until the evaluation value is optimized.

* * * * *